United States Patent
Chung et al.

(10) Patent No.: US 10,032,886 B2
(45) Date of Patent: *Jul. 24, 2018

(54) SEMICONDUCTOR DEVICE

(71) Applicant: SAMSUNG ELECTRONICS CO., LTD., Suwon-si, Gyeonggi-do (KR)

(72) Inventors: Jae-Yup Chung, Yongin-si (KR); Hyun-Jo Kim, Seoul (KR); Seong-Yul Park, Hwaseong-si (KR); Se-Wan Park, Seoul (KR); Jong-Mil Youn, Yongin-si (KR); Jeong-Hyo Lee, Suwon-si (KR); Hwa-Sung Rhee, Seongnam-si (KR); Hee-Don Jeong, Hwaseong-si (KR); Ji-Yong Ha, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/170,230

(22) Filed: Jun. 1, 2016

(65) Prior Publication Data
US 2016/0380075 A1 Dec. 29, 2016

(30) Foreign Application Priority Data
Jun. 24, 2015 (KR) .................. 10-2015-0089534

(51) Int. Cl.
| H01L 21/02 | (2006.01) |
| H01L 29/66 | (2006.01) |
| H01L 27/092 | (2006.01) |
| H01L 29/08 | (2006.01) |

(Continued)

(52) U.S. Cl.
CPC .. *H01L 29/66545* (2013.01); *H01L 21/76229* (2013.01); *H01L 21/823431* (2013.01); *H01L 21/823481* (2013.01); *H01L 27/0886* (2013.01); *H01L 27/0922* (2013.01); *H01L 29/0847* (2013.01); *H01L 29/6681* (2013.01);
(Continued)

(58) Field of Classification Search
CPC ........... H01L 29/66545; H01L 29/0847; H01L 29/7848; H01L 29/165; H01L 29/6681; H01L 29/66795; H01L 27/0922; H01L 21/823481; H01L 21/76229;
(Continued)

(56) References Cited

U.S. PATENT DOCUMENTS 8,502,301 B2    8/2013   Suzuki et al.
8,653,609 B2    2/2014   Lee et al.
(Continued)

FOREIGN PATENT DOCUMENTS

KR   10-2006-0064175 A   6/2006
KR   10-2014-0140852 A   12/2014

*Primary Examiner* — Jesse Y Miyoshi
(74) *Attorney, Agent, or Firm* — Lee & Morse P.C.

(57) ABSTRACT

A semiconductor device includes a fin-type pattern including a first short side and a second short side opposed to each other, a first trench in contact with the first short side, a second trench in contact with the second short side, a first field insulating film in the first trench, the first field insulating film including a first portion and a second portion arranged sequentially from the first short side, and a height of the first portion being different from a height of the second portion, a second field insulating film in the second trench, and a first dummy gate on the first portion of the first field insulating film.

11 Claims, 23 Drawing Sheets

(51) Int. Cl.
*H01L 29/78* (2006.01)
*H01L 21/762* (2006.01)
*H01L 21/8234* (2006.01)
*H01L 27/088* (2006.01)
*H01L 29/165* (2006.01)

(52) U.S. Cl.
CPC .... *H01L 29/66795* (2013.01); *H01L 29/7848* (2013.01); *H01L 29/7854* (2013.01); *H01L 29/7855* (2013.01); *H01L 29/165* (2013.01)

(58) Field of Classification Search
CPC ............. H01L 29/7855; H01L 29/7851; H01L 29/785; H01L 27/0886; H01L 21/823431
See application file for complete search history.

(56) References Cited

U.S. PATENT DOCUMENTS

| | | | |
|---|---|---|---|
| 8,680,625 B2 | 3/2014 | Fan et al. | |
| 8,766,256 B2 | 7/2014 | Chen et al. | |
| 8,853,035 B2 | 10/2014 | Yu et al. | |
| 8,878,309 B1* | 11/2014 | Hong | H01L 27/0886 257/330 |
| 9,041,115 B2 | 5/2015 | Liaw | |
| 9,059,090 B2 | 6/2015 | Kim et al. | |
| 9,064,799 B2 | 6/2015 | Chen et al. | |
| 9,105,722 B2 | 8/2015 | Greene et al. | |
| 9,136,175 B2 | 9/2015 | Wei et al. | |
| 9,178,044 B2 | 11/2015 | Kim et al. | |
| 2007/0235785 A1* | 10/2007 | Kahng | H01L 29/42384 257/297 |
| 2008/0035991 A1* | 2/2008 | Lee | H01L 27/10823 257/331 |
| 2008/0111194 A1* | 5/2008 | Kawakita | H01L 29/7851 257/365 |
| 2012/0074477 A1 | 3/2012 | Kawakita | |
| 2013/0240956 A1 | 9/2013 | Hou et al. | |
| 2014/0295630 A1 | 10/2014 | Chen et al. | |
| 2016/0155739 A1* | 6/2016 | Ting | H01L 29/0653 257/401 |

* cited by examiner

SEMICONDUCTOR DEVICE

CROSS-REFERENCE TO RELATED APPLICATION

Korean Patent Application No. 10-2015-0089534, filed on Jun. 24, 2015, in the Korean Intellectual Property Office, and entitled: "Semiconductor Device," is incorporated by reference herein in its entirety.

BACKGROUND

1. Field

Exemplary embodiments of the present disclosure relate to a semiconductor device, and more particularly, to a semiconductor device having a fin-type pattern.

2. Description of the Related Art

For semiconductor device density enhancement, a multi-gate transistor has been suggested as one of the scaling technologies, according to which a multi-channel active pattern (or silicon body) in a fin or nanowire shape is formed on a substrate, with gates then being formed on a surface of the multi-channel active pattern. The multigate transistor allows easy scaling, as it uses a three-dimensional channel. Further, the current control capability can be enhanced without requiring increased gate length of the multigate transistor. Furthermore, it is possible to effectively suppress short channel effect (SCE) which is the phenomenon that the electric potential of the channel region is influenced by the drain voltage.

SUMMARY

An exemplary embodiment provides a semiconductor device which has reduced leakage current and accordingly enhanced device operation performance and reliability.

According to an aspect of an exemplary embodiment, there is provided a semiconductor device including a fin-type pattern including a first short side and a second short side opposed to each other, a first trench in contact with the first short side, a second trench in contact with the second short side, a first field insulating film in the first trench, the first field insulating film including a first portion and a second portion arranged sequentially from the first short side, and a height of the first portion being different from a height of the second portion, a second field insulating film in the second trench, and a first dummy gate on the first portion of the first field insulating film.

In some embodiments, a height from a bottom of the first trench to an upper surface of the first portion of the first field insulating film is larger than a height from the bottom of the first trench to an upper surface of the second portion of the first field insulating film.

In some embodiments, at least a portion of the first dummy gate intersects the fin-type pattern.

In some embodiments, the first portion of the first field insulating film is in contact with an end of the fin-type pattern which includes the first short side.

In some embodiments, an upper surface of the first portion of the first field insulating film is in the same plane as, or higher than an upper surface of the fin-type pattern.

In some embodiments, an upper surface of the second field insulating film is in the same plane as, or higher than an upper surface of the fin-type pattern.

In some embodiments, the semiconductor device may further include a second dummy gate disposed on the second field insulating film.

In some embodiments, a width of the first field insulating film is larger than a width of the second field insulating film in an extending direction of a long side of the fin-type pattern.

In some embodiments, a first depth of the first trench is same as or larger than a second depth of the second trench.

In some embodiments, an upper surface of the second field insulating film is lower than an upper surface of the fin-type pattern.

In some embodiments, the semiconductor device may further include a second dummy gate formed on the second field insulating film and on the fin-type pattern. A shape of the first dummy gate is different from a shape of the second dummy gate.

In some embodiments, a bottom surface of the first dummy gate is higher than a bottom surface of the second dummy gate.

In some embodiments, the second dummy gate surrounds an end of the fin-type pattern which protrudes upward higher than the upper surface of the second field insulating film.

In some embodiments, the second field insulating film includes a third portion and a fourth portion located in a sequential order from the second short side, an upper surface of the third portion of the second field insulating film is higher than an upper surface of the fourth portion of the second field insulating film.

In some embodiments, the semiconductor device may further include a second dummy gate disposed on the third portion of the second field insulating film. At least a portion of the second dummy gate intersects the fin-type pattern.

In some embodiments, the first field insulating film further includes a protrusion protruding from the first portion of the first field insulating film, and extending along an upper surface of the fin-type pattern.

In some embodiments, at least a portion of the first dummy gate intersects the protrusion.

In some embodiments, the semiconductor device may further include a gate on the fin-type pattern, intersecting the fin-type pattern. The upper surface of the fin-type pattern at a portion overlapped with the gate is at a different height than the upper surface of the fin-type pattern at a portion overlapped with the protrusion.

In some embodiments, at the portion overlapped with the gate, a first height of the fin-type pattern is larger than a second height of the fin-type pattern, at the portion overlapped with the protrusion.

In some embodiments, the semiconductor device may further include an elevated source/drain formed in the fin-type pattern between the gate and the first dummy gate. The elevated source/drain has an asymmetrical shape.

In some embodiments, the semiconductor device may further include gate spacers is not formed on an upper surface of the first portion of the first field insulating film.

In some embodiments, at least a portion of the first dummy gate intersects the first portion of the first field insulating film.

In some embodiments, the first dummy gate is a metal gate.

According to another aspect of an exemplary embodiment, there is provided a semiconductor device including, a first fin-type pattern and a second fin-type pattern in an elongated alignment in a first direction, a trench formed between the first fin-type pattern and the second fin-type pattern, a field insulating film in the trench, extending in a second direction intersecting the first direction, and including a first portion and a second portion located in the first direction in a sequential order from the first fin-type pattern, wherein a height of the first portion is larger than a height of the second portion, a first dummy gate formed on the first fin-type pattern and on the first portion of the field insulating film, and a second dummy gate formed on the second fin-type pattern and on the field insulating film.

In some embodiments, an upper surface of the first portion of the first field insulating film is in the same plane as, or higher than an upper surface of the first fin-type pattern and an upper surface of the second fin-type pattern.

In some embodiments, the field insulating film further includes a third portion formed between the second portion of the field insulating film and the second fin-type pattern, an upper surface of the third portion of the field insulating film is higher than the upper surface of the second portion of the field insulating film.

In some embodiments, the second dummy gate is formed on the second fin-type pattern and on the third portion of the field insulating film.

In some embodiments, the third portion of the field insulating film is in contact with an end of the second fin-type pattern.

In some embodiments, a height from a bottom of the trench to an upper surface of the third portion of the field insulating film is same as a height from the bottom of the trench to an upper surface of the first portion of the field insulating film.

In some embodiments, the second dummy gate is formed on the second fin-type pattern and on the second portion of the field insulating film.

In some embodiments, the second dummy gate surrounds an end of the second fin-type pattern which protrudes upward higher than an upper surface of the field insulating film.

In some embodiments, a height of the second dummy gate is larger than a height of the first dummy gate.

In some embodiments, the semiconductor device may further include a third dummy gate formed between the first dummy gate and the second dummy gate, and on the second portion of the field insulating film.

In some embodiments, a height of the third dummy gate is larger than a height of the first dummy gate.

In some embodiments, the third dummy gate is a metal gate.

In some embodiments, the first portion of the field insulating film is in contact with an end of the first fin-type pattern.

In some embodiments, the first dummy gate and the second dummy gate are metal gates, respectively.

According to still another aspect an exemplary embodiment, there is provided a semiconductor device including, a fin-type pattern having a long side and a short side, a trench formed in contact with the short side of the fin-type pattern, a first field insulating film formed in the trench and including a first region and a second region, wherein an upper surface of the first region is lower than an upper surface of the fin-type pattern, and an upper surface of the second region is in the same plane as, or higher than the upper surface of the fin-type pattern, and a dummy gate formed on the second region of the first field insulating film and on the fin-type pattern, while intersecting the fin-type pattern.

In some embodiments, the second region of the first field insulating film is in contact with the short side of the fin-type pattern.

In some embodiments, the semiconductor device may further include a second field insulating film formed in contact with the long side of the fin-type pattern. An upper surface of the second field insulating film is lower than the upper surface of the fin-type pattern.

According to still another aspect of an exemplary embodiment, there is provided a semiconductor device including, a substrate having a first region and a second region, a first fin-type pattern in the first region, protruding from the substrate, a second fin-type pattern in the second region, protruding from the substrate, a first trench formed in contact with the short side of the first fin-type pattern, a second trench formed in contact with the short side of the second fin-type pattern, a first field insulating film formed in the first trench and including a first portion and a second portion located in a sequential order from the short side of the first fin-type pattern, wherein a height from a bottom of the first trench to an upper surface of the first portion is higher than a height from the bottom of the first trench to an upper surface of the second portion, a second field insulating film formed in the second trench, a first dummy gate formed on the first fin-type pattern and on the first portion of the first field insulating film, and a second dummy gate formed on the second fin-type pattern and on the second field insulating film, wherein a height of the first dummy gate is different from a height of the second dummy gate.

In some embodiments, the height of the second dummy gate is higher than the height of the first dummy gate.

In some embodiments, the upper surface of the first portion of the first field insulating film is in the same plane as, or higher than an upper surface of the first fin-type pattern.

In some embodiments, the upper surface of the second portion of the first field insulating film is lower than an upper surface of the first fin-type pattern, and an upper surface of the second field insulating film is lower than an upper surface of the second fin-type pattern.

In some embodiments, the second dummy gate surrounds an end of the second fin-type pattern which protrudes upward higher than an upper surface of the second field insulating film.

According to yet another aspect of an exemplary embodiment, there is provided a semiconductor device including, a fin-type pattern having first and second short sides spaced apart from each other along a first direction, a first trench in contact with the first short side of the fin-type pattern, a first field insulating film in the first trench, the first field insulating film including a first portion and a second portion arranged sequentially from the first short side, and a height of the first portion being different from a height of the second portion, and a dummy gate on the first portion of the first field insulating film, the dummy gate overlapping the fin-type pattern only along the first direction.

In some embodiments, the first portion of the first field insulating film contacts the first short side of the fin-type pattern and has an upper surface that is coplanar with an upper surface of the fin-type pattern, the dummy gate contacting a single surface of each of the first portion of the first field insulating film and the fin-type pattern.

In some embodiments, the dummy gate overlaps only a single surface of the fin-type pattern.

In some embodiments, the first field insulating film further comprises a protrusion protruding from the first portion of the first field insulating film to overlap a portion of an upper surface of the fin-type pattern, the dummy gate contacting the first portion of the first field insulating film and the protrusion.

In some embodiments, the protrusion completely separates between the dummy gate and the fin-type pattern.

BRIEF DESCRIPTION OF THE DRAWINGS

Features will become apparent to those of ordinary skill in the art by describing in detail exemplary embodiments with reference to the attached drawings, in which:

FIG. 9 illustrates a cross sectional view of a semiconductor device according to a fourth exemplary embodiment;

FIG. 13 illustrates a cross sectional view of a semiconductor device according to an eighth exemplary embodiment;

DETAILED DESCRIPTION

Figure 1:
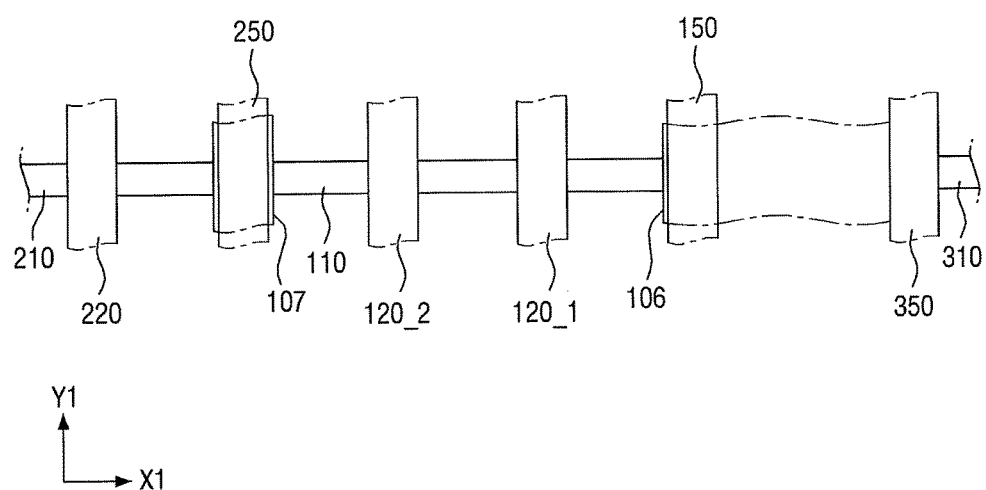
FIGS. 1 and 2 illustrate a top view and a perspective view, respectively, of a semiconductor device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "connected to," "coupled to," or "on" another layer or substrate, it can be directly connected to, coupled to, or on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The use of the terms "a" and "an" and "the" and similar referents in the context of describing example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate embodiments and is not a limiting unless otherwise specified. Further, unless defined otherwise, all terms defined in generally used dictionaries may not be overly interpreted.

Hereinbelow, a semiconductor device according to the first exemplary embodiment will be explained with reference to FIGS. 1 to 5.

Figure 2:
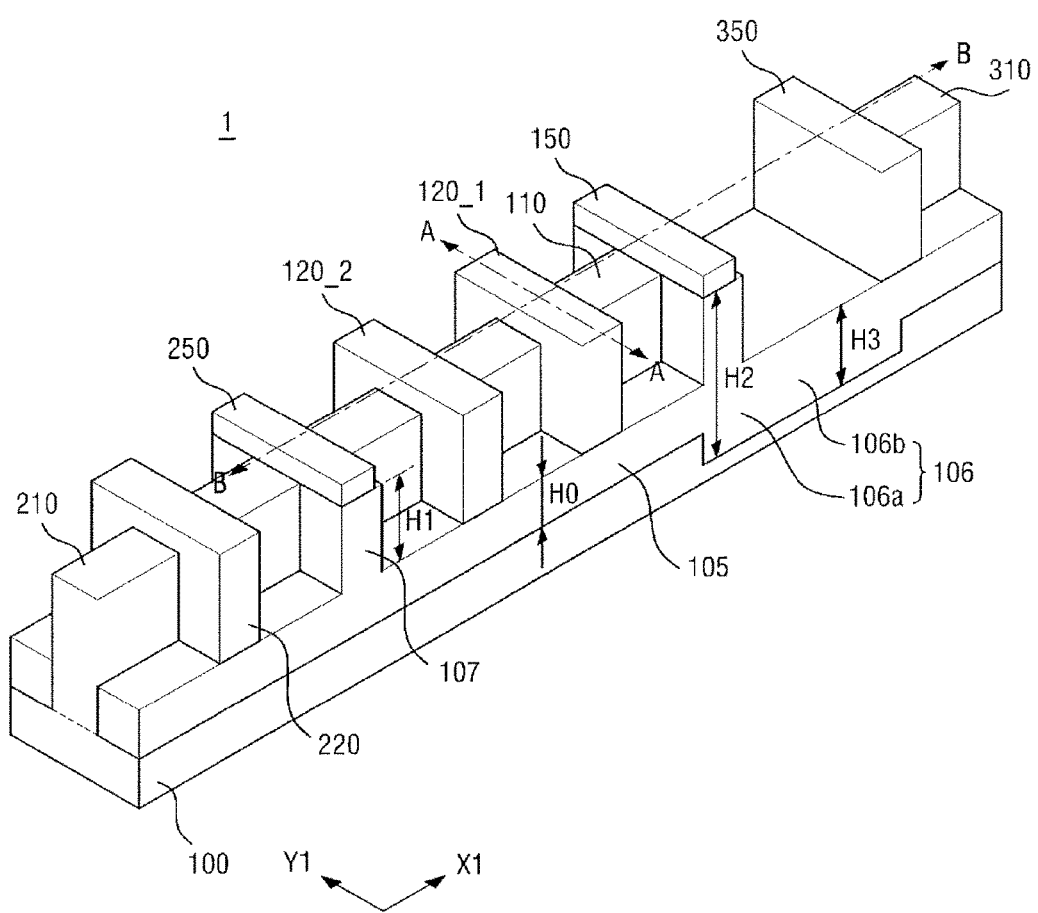
Figure 3:
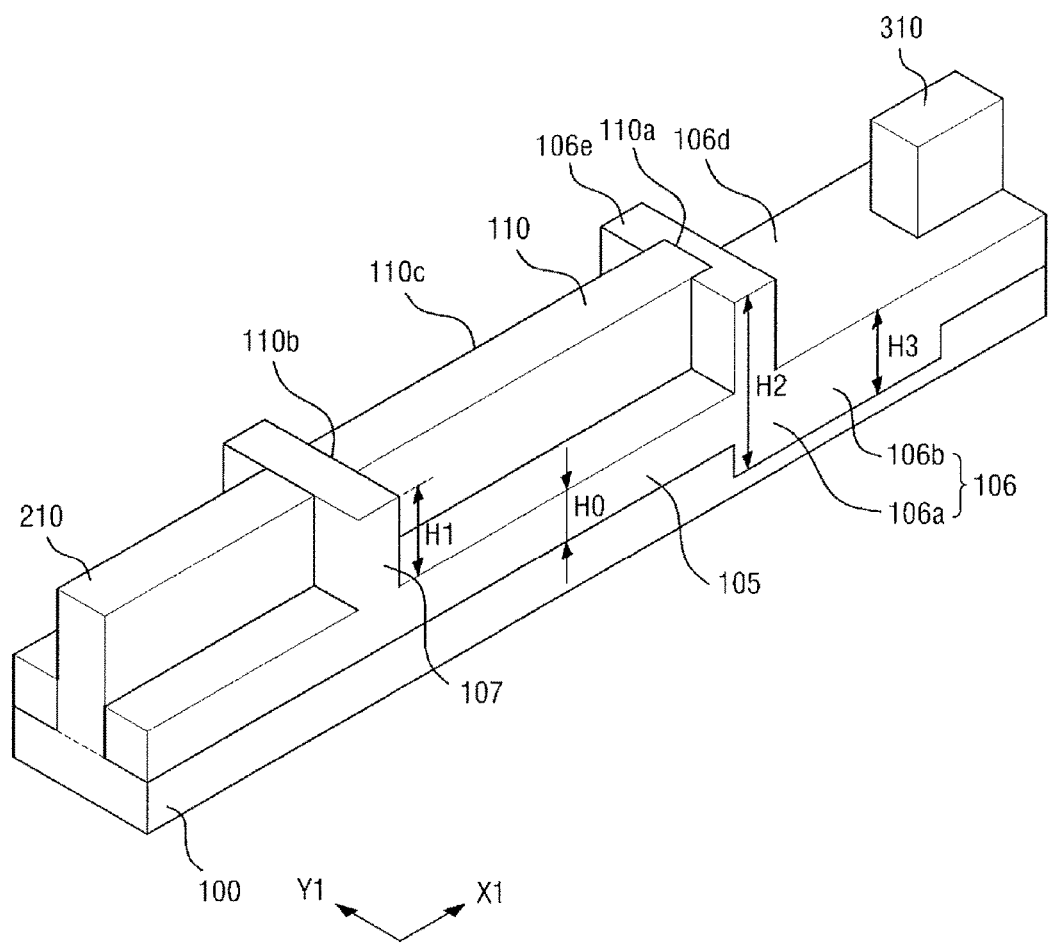
FIG. 3 illustrates a partial perspective view of a fin-type pattern and a field insulating film of the semiconductor device of FIGS. 1 and 2.
Figure 4A:
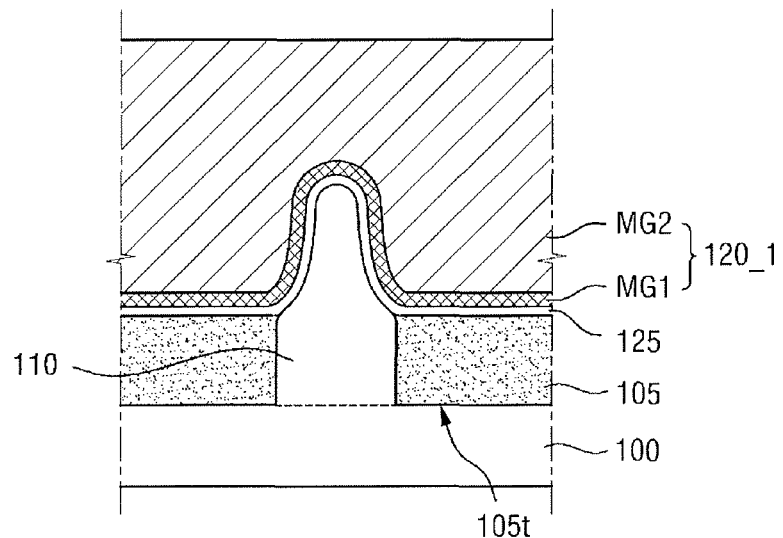
FIGS. 4A and 4B illustrate cross sectional views taken along line A-A of FIGS. 1 and 2.
Figure 4B:
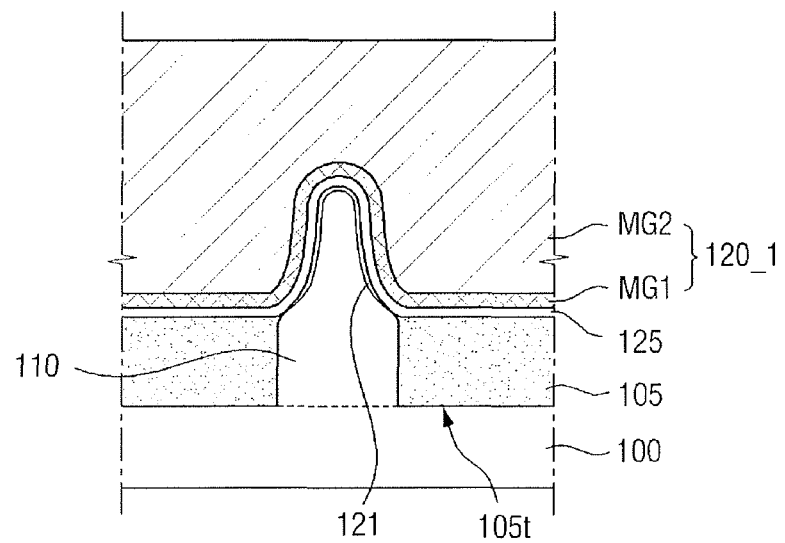
Figure 5:
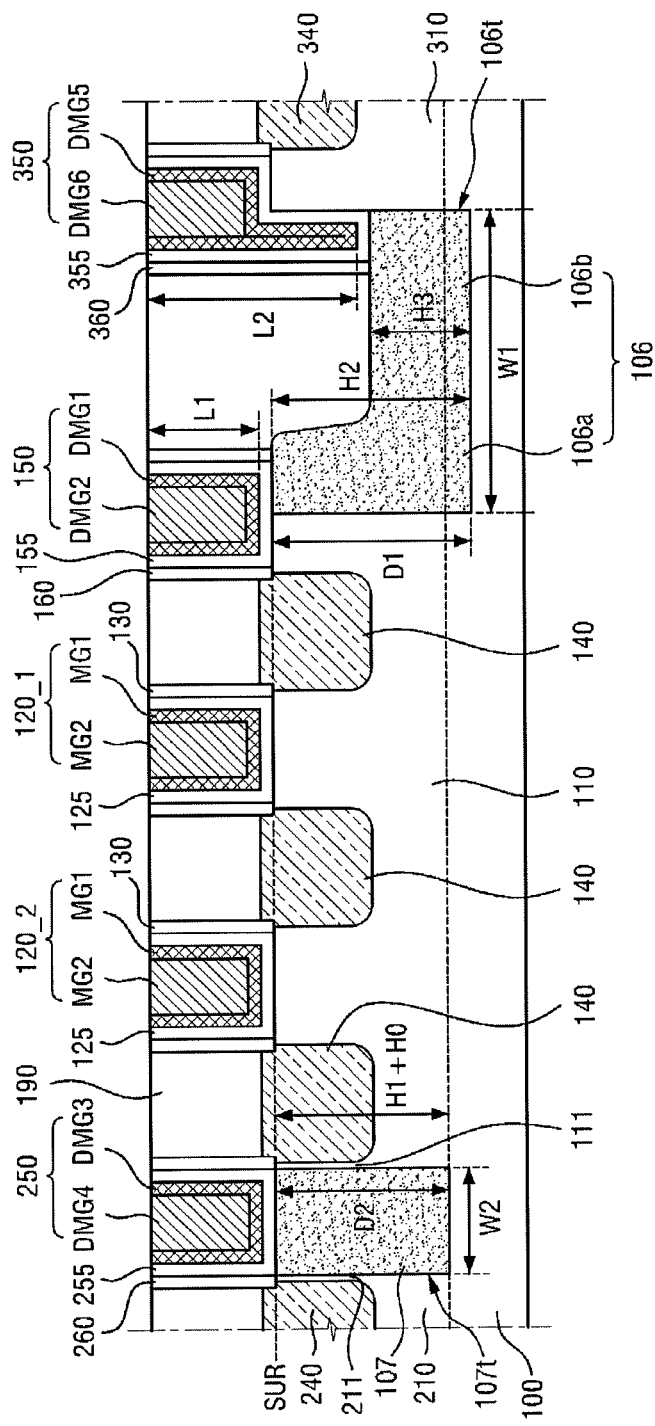
FIG. 5 illustrates a cross sectional view taken along line B-B of FIGS. 1 and 2.

FIGS. 1 and 2 are a top view and a perspective view of a semiconductor device according to a first exemplary embodiment. FIG. 3 is a partial perspective view of a fin-type pattern and a field insulating film of the semiconductor device of FIGS. 1 and 2. That is, FIG. 3 shows the semiconductor device of FIG. 2 without gates and dummy gates. FIGS. 4A and 4B are cross sectional views taken along line A-A of FIGS. 1 and 2. FIG. 5 is a cross sectional view taken along line B-B of FIGS. 1 and 2.

For reference, the fin-type pattern illustrated in FIGS. 1 to 3 includes a source/drain formed on the fin-type pattern. Further, although the fin-type pattern configuration is illustrated in the drawings, a body in a wire pattern configuration may be implemented instead of the fin-type pattern configuration.

Referring to FIGS. 1 to 5, a semiconductor device 1 according to the first exemplary embodiment may include first through third field insulating films 105, 106, 107, a first fin-type pattern 110, a second fin-type pattern 210, a third fin-type pattern 310, a plurality of gates 120_1, 120_2, 220, a first dummy gate 150, a second dummy gate 250, and a third dummy gate 350 on a substrate 100.

For example, the substrate 100 may be a bulk silicon or a silicon-on-insulator (SOI). In another example, the substrate 100 may be a silicon substrate, or may include other substance, e.g., silicon germanium, indium antimonide, lead telluride compound, indium arsenide, indium phosphide, gallium arsenide, or gallium antimonide. In yet another example, the substrate 100 may be a base substrate having an epitaxial layer formed thereon.

The first fin-type pattern 110, the second fin-type pattern 210, and the third fin-type pattern 310 may protrude from the substrate 100. The first fin-type pattern 110, the second fin-type pattern 210, and the third fin-type pattern 310 may be elongated in a first direction X1, respectively. The first fin-type pattern 110, the second fin-type pattern 210, and the third fin-type pattern 310 may be formed abreast in a lengthwise direction, e.g., the first fin-type pattern 110, the second fin-type pattern 210, and the third fin-type pattern 310 may be aligned along a same imaginary line in the first direction X1.

For example, the first fin-type pattern 110, being elongated in the first direction X1, may include a long side 110c formed in the first direction X1, and short sides 110a, 110b formed in a second direction Y1. The first short side 110a and the second short side 110b of the first fin-type pattern 110, which are connected by the long side 110c, are opposed to each other, i.e., at opposite sides of the long side 10c. By the statement that the first fin-type pattern 110 and the second fin-type pattern 210 are formed abreast in the lengthwise direction, it means that the second short side 110b of the first fin-type pattern 110 and the short side of the second fin-type pattern 210 are opposed to each other, e.g., facing and overlapping each other. By the statement that the first fin-type pattern 110 and the third fin-type pattern 310 are formed abreast in the lengthwise direction, it means that the first short side 110a of the first fin-type pattern 110 and the short side of the third fin-type pattern 310 are opposed to each other, e.g., facing and overlapping each other.

As exemplified in the drawings, the first to the third fin-type patterns 110, 210, 310 may be formed in a rectangular parallelepiped shape, but exemplary embodiments are not limited thereto. Accordingly, the first to the third fin-type patterns 110, 210, 310 may be in a chamfered shape, e.g., the first to the third fin-type patterns 110, 210, 310 may be shaped such that the corners may be rounded.

The first to the third fin-type patterns 110, 210, 310 refer to active patterns for use in a multigate transistor. Accordingly, the first to the third fin-type patterns 110, 210, 310 may be formed, as the channels are connected along three surfaces of the fins or formed on two opposed surfaces of the fins.

The first to the third fin-type patterns 110, 210, 310 may each be part of the substrate 100, and may include an epitaxial layer grown on the substrate 100. The first to the third fin-type patterns 110, 210, 310 may include an element semiconductor material, e.g., silicon or germanium. Further, the first to the third fin-type patterns 110, 210, 310 may include a compound semiconductor, e.g., IV-IV group compound semiconductor or III-V group compound semiconductor. For example, if the first to the third fin-type patterns 110, 210, 310 include a IV-IV group compound, the first fin-type pattern 110 and the second fin-type pattern 210 may be a binary compound or a ternary compound including at least two or more of carbon (C), silicon (Si), germanium (Ge) and tin (Sn), or these compounds doped with IV group element. In another example, if the first to the third fin-type patterns 110, 210, 310 include a III-V group compound, the first to the third fin-type pattern 110, 210, 310 may include a binary compound, a ternary compound or a quaternary compound which is formed by a combination of a III group element, e.g., at least one of aluminum (Al), gallium (Ga), and indium (In), with a V group element, e.g., at least one of phosphorus (P), arsenic (As) and antimony (Sb). In the semiconductor device according to exemplary embodiments, it is assumed that the first to the third fin-type patterns 110, 210, 310 are silicon fin-type patterns which include silicon.

As illustrated in FIGS. 3-5, a plurality of trenches maybe formed among the first to the third fin-type patterns 110, 210, 310. In detail, as illustrated in FIGS. 3 and 4A-4B, a first trench 105t may be formed in the substrate 100 to contact, e.g., and define, the long side 110c of the first fin-type pattern 110. Further, as illustrated in FIGS. 3-5, a second trench 106t may be formed between the first fin-type pattern 110 and the third fin-type pattern 310. The second trench 106t may be formed in contact with the first short side 110a of the first fin-type pattern 110 and the short side of the third fin-type pattern 310. A third trench 107t may be formed between the first fin-type pattern 110 and the second fin-type pattern 210. The third trench 107t may be formed in contact with the second short side 110b of the first fin-type pattern 110 and the short side of the second fin-type pattern 210. The second trench 106t may be disposed between the short side of the first fin-type pattern 110 and the short side of the third fin-type pattern 310, which are opposed to each other, and the third trench 107t may be disposed between the short side of the first fin-type pattern 110 and the short side of the second fin-type pattern 210, which are opposed to each other.

In a semiconductor device according to the first exemplary embodiment, the second trench 106t may be a deep trench, and the first trench 105t and the third trench 107t may be shallow trenches. For example, the first depth D1 of the second trench 106t may be deeper than the second depth D2 of the third trench 107t.

The depth of the first trench 105t may be same as the depth D2 of the third trench 107t, although exemplary embodiments are not limited thereto. This is because the first trench 105t and the third trench 107t may be formed simultaneously. Note that when the first trench 105t and the third trench 107t are formed separately, then the depth of the first trench 105t and the depth of the third trench 107t may be different from each other. Additionally, in the semiconductor device according to the first exemplary embodiment, the width w1 of the second trench 106t in the first direction X1 may be larger than the width w2 of the third trench 107t in the first direction X1.

The field insulating films 105, 106, 107 may be formed on the substrate 100 and disposed around the first to the third fin-type patterns 110, 210, 310. The field insulating films 105, 106, 107 may be formed so as to partially surround the first to the third fin-type patterns 110, 210, 310. Hereinbelow, an exemplary embodiment will be explained mainly with reference to the field insulating films 105, 106, 107 formed around the first fin-type pattern 110.

The first field insulating film 105 may be elongated in the first direction X1, and the second field insulating film 106 and the third field insulating film 107 may be elongated in the second direction Y1. For example, each of the field insulating films 105, 106, 107 may be an oxide layer, a nitride layer, an oxynitride layer or a layer combining the same.

In detail, the first field insulating film 105 may be formed in at least a portion of the first trench 105t, the second field insulating film 106 may be formed in at least a portion of the second trench 106*t*, and the third field insulating film 107 may be formed in at least a portion of the third trench 107*t*. In other words, the first field insulating film 105 may be formed in contact with the long side 110*c* of the first fin-type pattern 110. The second field insulating film 106 may be formed in contact with the first short side 110*a* of the first fin-type pattern 110 and the short side of the third fin-type pattern 310, and the third field insulating film 107 may be formed in contact with the second short side 110*b* of the first fin-type pattern 110 and the short side of the second fin-type pattern 210. That is, the second field insulating film 106 may directly contact the short side of the first fin-type pattern 110 and the short side of the third fin-type pattern 310, and the third field insulating film 107 may directly contact the short side of the first fin-type pattern 110 and the short side of the second fin-type pattern 210.

For example, the first field insulating film 105 may be formed in only a portion of the first trench 105*t*. Further, the second field insulating film 106 may be formed in a portion of the second trench 106*t*, and the third field insulating film 107 may completely fill the third trench 107*t*.

More specifically, the second field insulating film 106 that fills the second trench 106*t* may include a first portion 106*a* and a second portion 106*b*. The first portion 106*a* of the second field insulating film and the second portion 106*b* of the second field insulating film may be integral with each other to have coplanar bottom surfaces, and may be arranged in a sequential order in the first direction X1 from the first short side 110*a* of the first fin-type pattern 110 toward the third fin-type pattern 310. That is, the first portion 106*a* of the second field insulating film may directly contact the first short side 110*a* of the first fin-type pattern 110. The first portion 106*a* of the second field insulating film 106 may contact an end of the first fin-type pattern 110, which includes the first short side 110*a*. The first portion 106*a* of the second field insulating film 106 may be located between the first fin-type pattern 110 and the second portion 106*b* of the second field insulating film 106. For example, as illustrated in FIG. 3, the first portion 106*a* of the second field insulating film 106 may extend along the, e.g., entire, height of the first fin-type pattern 110 to contact the entire first short side 110*a* and small portions of the long sides 110*c*, e.g., the first portion 106*a* of the second field insulating film 106 may have a short Π shape when viewed from a top view to contact three different surfaces of the first fin-type pattern 110.

The height of an upper surface 106*e* of the first portion 106*a* of the second field insulating film 106 may be different from the height of an upper surface 106*d* of the second portion 106*b* of the second field insulating film 106. In detail, referring to FIG. 3, the height of the first field insulating film 105 may be H0, and the height of the third field insulating film 107 may be H0+H1. The second field insulating film 106 may include a portion at a height H2, and a portion at a height H3. It is noted that each height is measured from a bottommost surface of a corresponding field insulating film along a normal direction to the substrate 100.

The height of the first portion 106*a* of the second field insulating film 106 may be H2, and the height of the second portion 106*b* of the second field insulating film 106 may be H3. In other words, the height from the bottom of the second trench 106*t* to the upper surface 106*e* of the first portion 106*a* of the second field insulating film 106 may be H2, and the height from the bottom of the second trench 106*t* to the upper surface 106*d* of the second portion 106*b* of the second field insulating film 106 may be H3.

The third field insulating film 107 may be higher than the first field insulating film 105 by H1. The first portion 106*a* of the second field insulating film 106 may be higher than the first field insulating film 105 by H2-H0, and the second portion 106*b* of the second field insulating film 106 may be higher than the first field insulating film 105 by H3-H0. The first portion 106*a* of the second field insulating film may be higher than the third field insulating film 107 by H2−(H0+H1).

As illustrated in FIG. 5, the upper surface 106*e* of the first portion 106*a* of the second field insulating film 106 and the upper surface of the third field insulating film 107 may be coplanar with the upper surface SUR of the first fin-type pattern 110. The upper surface 106*e* of the first portion 106*a* of the second field insulating film 106 and the upper surface of the third field insulating film 107 may be in the same plane as the upper surface SUR of the first fin-type pattern 110.

Further, the upper surface of the third field insulating film 107 may be coplanar with the upper surface SUR of the second fin-type pattern 210. That is, the upper surface of the third field insulating film 107 may be in the same plane as the upper surface SUR of the second fin-type pattern 210.

Meanwhile, the upper surface 106*d* of the second portion 106*b* of the second field insulating film may be lower than the upper surface SUR of the third fin-type pattern 310. The upper surface 106*e* of the first portion 106*a* of the second field insulating film 106 may be coplanar with the upper surface SUR of the third fin-type pattern 310. The upper surface 106*e* of the first portion 106*a* of the second field insulating film 106 may be in the same plane as the upper surface SUR of the third fin-type pattern 310.

Referring to FIGS. 3 and 5, the second field insulating film 106 filling the second trench 106*t* may include the upper surface 106*d* of the second portion 106*b* partially filling the second trench 106*t*, and the upper surface 106*e* of the first portion 106*a* protruding upward from, e.g., above, the upper surface 106*d* of the second portion 106*b*. The upper surface 106*e* of the first portion 106*a* may extend in the second direction Y1. Further, the upper surface 106*e* of the first portion 106*a* may be higher than the upper surface of the first field insulating film 105. The upper surface 106*e* of the first portion 106*a* which protrudes above the upper surface 106*d* of the second portion 106*b* may contact the short side 110*a* of the first fin-type pattern 110.

The upper surface 106*d* of the second portion 106*b* may be lower than the upper surface SUR of the first fin-type pattern 110 and the upper surface SUR of the third fin-type pattern 310. Meanwhile, the upper surface 106*e* of the first portion 106*a* may be coplanar with the upper surface SUR of the first fin-type pattern 110. The upper surface 106*e* of the first portion 106*a* may be in the same plane as the upper surface SUR of the first fin-type pattern 110. The second field insulating film 106 may include portions having different heights from the bottom of the second trench 106*t*.

A plurality of gates 120_1, 120_2, 220 may be formed on the corresponding fin-type patterns 110, 210, while intersecting the corresponding fin-type patterns 110, 210. The plurality of gates 120_1, 120_2, 220 may extend in the second direction Y1, respectively. For example, the first gates 120_1, 120_2 may be formed on the first fin-type pattern 110, while intersecting the first fin-type pattern 110. While two first gates 120_1, 120_2 intersecting the first fin-type pattern 110 are illustrated for convenience of explanation, note that the exemplary embodiments are not limited thereto. The second gate 220 may be formed on the second fin-type pattern 210, while intersecting the second fin-type pattern 210. A gate may intersect the third fin-type pattern 310.

The first dummy gate 150 extending in the second direction Y1 may be disposed on the first portion 106a of the corresponding second field insulating film 106. There may be one first dummy gate 150 formed on the first portion 106a of the corresponding second field insulating film 106.

In detail, the first dummy gate 150 may be formed on the first portion 106a of the second field insulating film 106 and on a portion of the first fin-type pattern 110. For example, as illustrated in FIG. 2, the first dummy gate 150 may have a flat shape contacting only upper surfaces of the second field insulating film 106 and the first fin-type pattern 110, i.e., without contacting lateral surfaces of the second field insulating film 106 and on a portion of the first fin-type pattern 110.

For example, as illustrated in FIG. 3, when the first portion 106a of the second field insulating film 106 contacts three surfaces of the first fin-type pattern 110 and has an upper surface 106e coplanar with that of the first fin-type pattern 110, the first dummy gate 150 may contact the upper surface 106e of the first portion 106a at a portion of the upper surface of the first fin-type pattern 110 enclosed by the first portion 106a. As such, an overlap area between the first fin-type pattern 110 and the first dummy gate 150 is reduced, thereby minimizing leakage current and enhancing device operation performance and reliability.

At least a portion of the first dummy gate 150 may be formed so as to intersect, e.g., overlap, the first fin-type pattern 110. In other words, the first dummy gate 150 may be formed on the upper surface 106e of the first portion 106a which protrudes from the upper surface 106d of the second portion 106b. At least a portion of the first dummy gate 150 formed on the upper surface 106e of the first portion 106a may be formed so as to intersect the first fin-type pattern 110.

The second dummy gate 250 extending in the second direction Y1 may be disposed on the corresponding third field insulating film 107. There may be one second dummy gate 250 on each corresponding third field insulating film 107. By forming one dummy gate 250 on the third field insulating film 107 rather than two or more dummy gates, the layout size can be reduced.

The third dummy gate 350 extending in the second direction Y1 may be formed on the third fin-type pattern 310 and the second field insulating film 106. More specifically, the third dummy gate 350 may be formed on the third fin-type pattern 310 and on the second portion 106b of the second field insulating film.

A portion of the third dummy gate 350 may be formed on the second portion 106b of the second field insulating film, which is lower than the upper surface SUR of the third fin-type pattern 310. That is, the third dummy gate 350 may surround the end of the third fin-type pattern 310 which protrudes higher than the second field insulating film 106, i.e., higher than the upper surface of the second portion 106b of the second field insulating film.

The first gates 120_1, 120_2 may include metal layers MG1, MG2. As illustrated, the first gates 120_1, 120_2 may include a stack of two or more metal layers MG1, MG2. The first metal layer MG1 plays a role of adjusting a work function, and the second metal layer MG2 plays a role of filling a space defined by the first metal layer MG1. For example, the first metal layer MG1 may include at least one of, e.g., TiN, WN, TiAl, TiAlN, TaN, TiC, TaC, TaCN, TaSiN and a combination thereof, but not limited thereto. Further, the second metal layer MG2 may include at least one of, e.g., W, Al, Cu, Co, Ti, Ta, poly-Si, SiGe and a metal alloy, but not limited thereto. For example, the first gate electrodes 120_1, 120_2 may be formed by replacement process (or gate last process), but not limited thereto.

As illustrated, the first dummy gate 150 may have a stack of two or more metal layers DGM1, DGM2. For example, the first dummy metal layer DMG1 may play a role of adjusting a work function, and the second metal layer DMG2 may play a role of filling a space defined by the first dummy metal layer DMG1. The first dummy gate 150 may include a material substantially the same as the first gates 120_1, 120_2. Similar to the first dummy gate 150, the second dummy gate 250 may include a third dummy metal layer DMG3 and a fourth dummy metal layer DMG4, and the third dummy gate 350 may include a fifth dummy metal layer DMG5 and a sixth dummy metal layer DMG6.

As described above, the upper surface 106e of the first portion 106a of the second field insulating film 106 and the upper surface of the third field insulating film 107 are higher than the upper surface of the first field insulating film 105. As such, the bottom surface of the first dummy gate 150 and the bottom surface of the second dummy gate 250, which are on respective upper surfaces of the first portion 106a of the second field insulating film 106 and of the third field insulating film 107, may be higher than the bottom surfaces of the first gates 120_1, 120_2, which contact the upper surface of the first field insulating film 105. Further, the bottom surface of the first dummy gate 150 and the bottom surface of the second dummy gate 250 may be higher than the upper surface SUR of the first fin-type pattern 110.

The first gates 120_1, 120_2 may be formed on the first field insulating film 105 and on the first fin-type pattern 110 protruding higher than the first field insulating film 105. For example, the "bottom surfaces" of the first gates 120_1, 120_2 refer to the lowest portions of the bottoms of the first gates 120_1, 120_2, e.g., which contact the first field insulating film 105, and referring to FIG. 2, the "bottom surfaces" may be the bottom surfaces opposed to the upper surface of the first field insulating film 105.

Additionally, the upper surface 106e of the first portion 106a of the second field insulating film and the upper surface of the third field insulating film 107 are higher than the upper surface 106d of the second portion 106b of the second field insulating film. As such, the bottom surface of the first dummy gate 150 and the bottom surface of the second dummy gate 250 may be higher than the bottom surface of the third dummy gate 350 which is at least partially formed on the second portion 106b of the second field insulating film.

For example, the first dummy gate 150 and the third dummy gate 350 may be formed by the replacement process, in which case the upper surface of the first dummy gate 150 and the upper surface of the third dummy gate 350 may be in the same plane.

The bottom surface of the first dummy gate 150 may be higher than the bottom surface of the third dummy gate 350, i.e., relative to the substrate 100, in which case the height L1 of the first dummy gate 150 may be smaller than the height L2 of the third dummy gate. In other words, the first dummy gate 150 and the third dummy gate 350 formed on the second field insulating film 106 may have different shapes from each other.

A first gate insulating film 125 may be formed between the first fin-type pattern 110 and the first gate 120. The first gate insulating film 125 may be formed along the profile of the first fin-type pattern 110 protruding upward higher than the first field insulating film 105. Further, the first gate insulating film 125 may be disposed between the first gate 120 and the first field insulating film 105.

Further, an interfacial layer 121 may be additionally formed between the first gate insulating film 125 and the first fin-type pattern 110 (FIG. 4B). Although not illustrated, referring to FIG. 5, an interfacial layer may also be additionally formed between the first gate insulating film 125 and the first fin-type pattern 110.

As illustrated in FIG. 4B, the interfacial layer 121 may be formed along the profile of the first fin-type pattern 110 which protrudes higher than the upper surface of the first field insulating film 105, although exemplary embodiments are not limited thereto. The interfacial layer 121 may extend along the upper surface of the first field insulating film 105 according to a method used for forming the interfacial layer 121. Hereinbelow, exemplary embodiments are explained by referring to FIGS. 4A and 5, in which illustration of the interfacial layer 121 is omitted for convenience of explanation.

The first gate insulating film 125 may include a high-k dielectric material having a higher dielectric constant than a silicon oxide layer. For example, the first gate insulating film 125 may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

The first dummy gate insulating film 155 may be formed between the first portion 106a of the second field insulating film and the first dummy gate 150, and between the first fin-type pattern 110 and the first dummy gate 150. The second dummy gate insulating film 255 may be formed between the third field insulating film 107 and the second dummy gate 250, and the third dummy gate insulating film 355 may be formed between the third dummy gate 350 and the third fin-type pattern 310. The first to the third dummy gate insulating films 155, 255, 355 may include a material substantially the same as the first gate insulating film 125.

The first spacers 130 may be disposed on sidewalls of the first gates 120_1, 120_2 extending in the second direction Y1. A first dummy spacer 160 may be formed on a sidewall of the first dummy gate 150, a second dummy spacer 260 may be formed on a sidewall of the second dummy gate 250, and a third dummy spacer 360 may be formed on a sidewall of the third dummy gate 350. The first dummy spacers 160 formed on both sidewalls of the first dummy gate 150 may be formed on the first portion 106a of the second field insulating film. For example, the first spacer 130, and the first to the third dummy spacers 160, 260, 360 may include at least one of silicon nitride (SiN), silicon oxynitride (SiON), silicon oxide (SiO$_2$), silicon oxycarbonitride (SiOCN), and a combination thereof.

A first source/drain 140 may be formed between the first gates 120_1 and 120_2, between the first gate 120_1 and the first dummy gate 150, or between the first gate 120_2 and the second dummy gate. For example, the first source/drain 140, which may be formed on the first fin-type pattern 110, may have an elevated source/drain form.

A second source/drain 240 may be formed on the second fin-type pattern 210 located on one side of the second dummy gate 250. A third source/drain 340 may be formed on the third fin-type pattern 310 located on one side of the third dummy gate 350. Further, a first semiconductor layer 111, which is part of the first fin-type pattern 110, may be located between the first source/drain 140 adjacent to the third field insulating film 107 and the third field insulating film 107. Additionally, a second semiconductor layer 211, which is part of the second fin-type pattern 210, may be located between the second source/drain 240 adjacent to the third field insulating film 107 and the third field insulating film 107.

For example, when the semiconductor device 1 according to the first exemplary embodiment is a PMOS transistor, the first source/drain 140 may include a compressive stress material. For example, the compressive stress material may be SiGe which has a higher lattice constant compared to Si. For example, the compressive stress material can enhance mobility of the carrier in the channel region by applying compressive stress on the first fin-type pattern 110.

In another example, when the semiconductor device 1 according to the first exemplary embodiment is an NMOS transistor, the first source/drain 140 may be the same material as the substrate 100 or may be a tensile stress material. For example, when the substrate 100 is Si, the first source/drain region 140 may be Si, or a material (e.g., SiC) that has a lower lattice constant than Si.

For example, the first source/drain 140 may be formed by doping the first fin-type pattern 110 with impurity. Description about the second source/drain 240 and the third source/drain 340 may be substantially the same as the description about the first source/drain 140 provided above.

An interlayer insulating film 190 may be formed on the first source/drain 140 and the second source/drain 240. Further, the interlayer insulating film 190 may be formed so as to surround the first gates 120_1, 120_2, and the first to the third dummy gate electrodes 150, 250, 350.

For example, the interlayer insulating film 190 may include at least one of silicon oxide, silicon nitride, silicon oxynitride, and a low-k dielectric material. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK™, polyimide, porous polymeric material, or a combination thereof, but not limited thereto.

Figure 6:
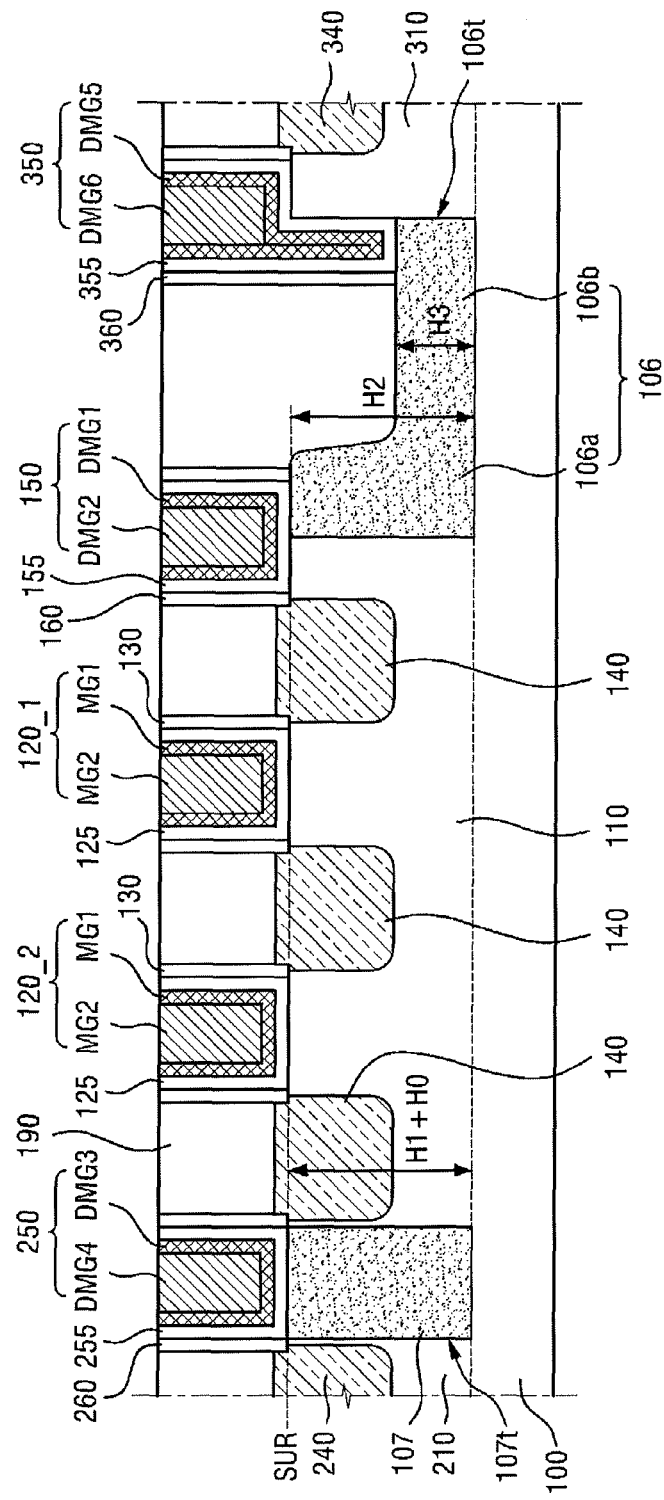
FIG. 6 illustrates a cross sectional view of a modified example of a semiconductor device according to the first exemplary embodiment.

FIG. 6 is a view provided to explain a modified example of a semiconductor device according to the first exemplary embodiment.

Referring to FIG. 6, in a semiconductor device according to the modified example (1a) of the first exemplary embodiment, the depth of the second trench 106t may be substantially the same as the depth of the third trench 107t. In other words, all of the first trench 105t, the second trench 106t, and the third trench 107t may be shallow trenches or deep trenches.

The upper surfaces SUR of the first to the third fin-type patterns 110, 210, 310 may be in the same plane as the upper surface 106e of the first portion 106a of the second field insulating film and the upper surface of the third field insulating film 107, in which case the height H2 of the first portion 106a of the second field insulating film may be substantially the same as the height (H0+H1) of the third field insulating film 107.

Figure 7:
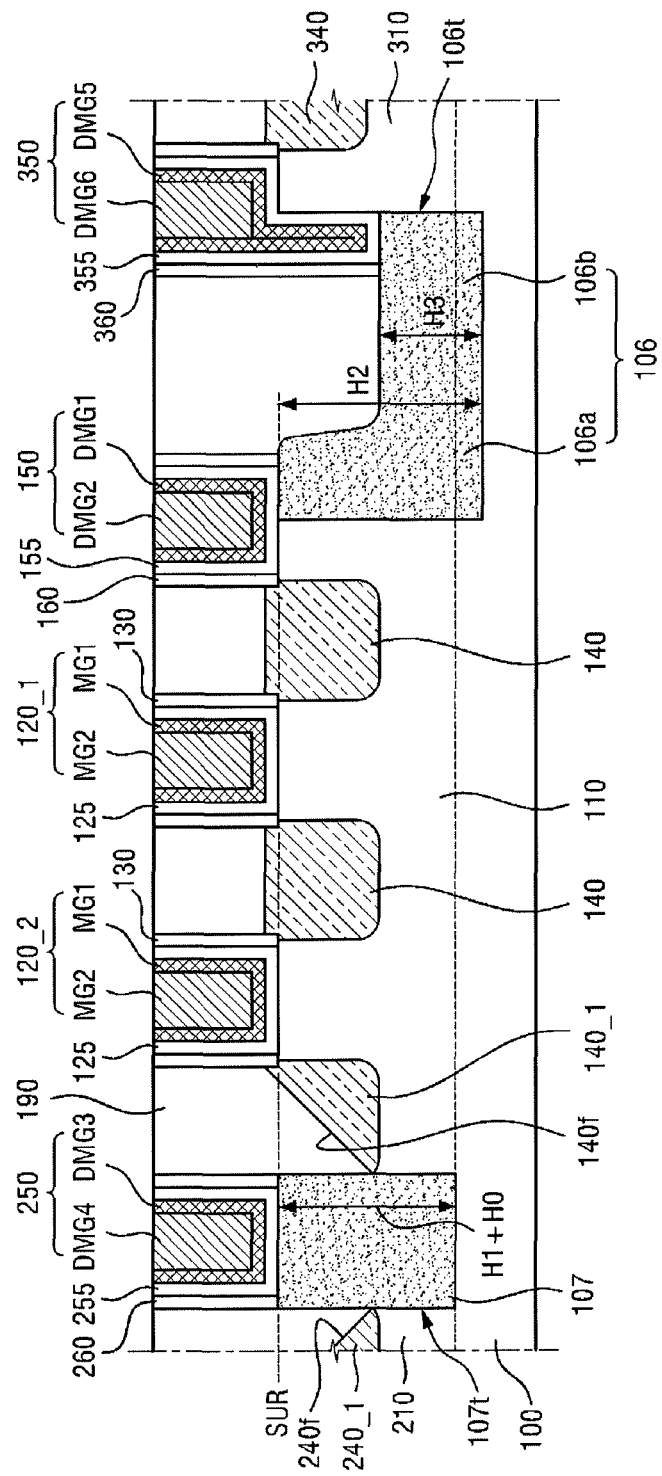
FIG. 7 illustrates a cross sectional view of a semiconductor device according to a second exemplary embodiment.

FIG. 7 is a view provided to explain a semiconductor device according to the second exemplary embodiment. For convenience of explanation, differences that are not explained above with reference to FIGS. 1 to 5 will be mainly explained below.

Referring to FIG. 7, in the semiconductor device 2 according to the second exemplary embodiment, the first source/drain 140_1 and the second source/drain 240_1 disposed on both sides of the second dummy gate 250 may contact the third field insulating film 107, respectively.

The first source/drain 140_1 formed on one side of the second dummy gate 250 may include a first facet 140f. The first facet 140f may begin from the sidewall of the third field insulating film 107 which is lower than the upper surface (SRU) of the first fin-type pattern 110. Accordingly, a portion of the first fin-type pattern 110 (i.e., the first semiconductor layer 111 of FIG. 5) may not be disposed between the first source/drain 140_1 formed on one side of the second dummy gate 250 and the third field insulating film 107.

In a cross sectional view, a portion of the interlayer insulating film 190 may be interposed between the sidewall of the third field insulating film 107 and the first facet 140f of the first source/drain 140_1.

The second source/drain 240_1 formed on the other side of the second dummy gate 250 may include a second facet 240f. The second facet 240f may begin from the sidewall of the third field insulating film 107 which is lower than the upper surface SUR of the second fin-type pattern 210. Accordingly, a portion of the second fin-type pattern 210 (i.e., the second semiconductor layer 211 of FIG. 5) may not be interposed between the second source/drain 240_1 formed on the other side of the second dummy gate 250 and the third field insulating film 107.

In a cross sectional view, a portion of the interlayer insulating film 190 may be interposed between the sidewall of the third field insulating film 107 and the second facet 240f of the second source/drain 240_1.

Unlike the example as illustrated, one of the first and the second sources/drains 140_1, 240_1 that is adjacent to the second dummy gate 250 may not include a facet.

At least one of the second dummy spacers 260 formed on both sidewalls of the second dummy gate 250 may be formed on the upper surface of the third field insulating film 107.

Figure 8:
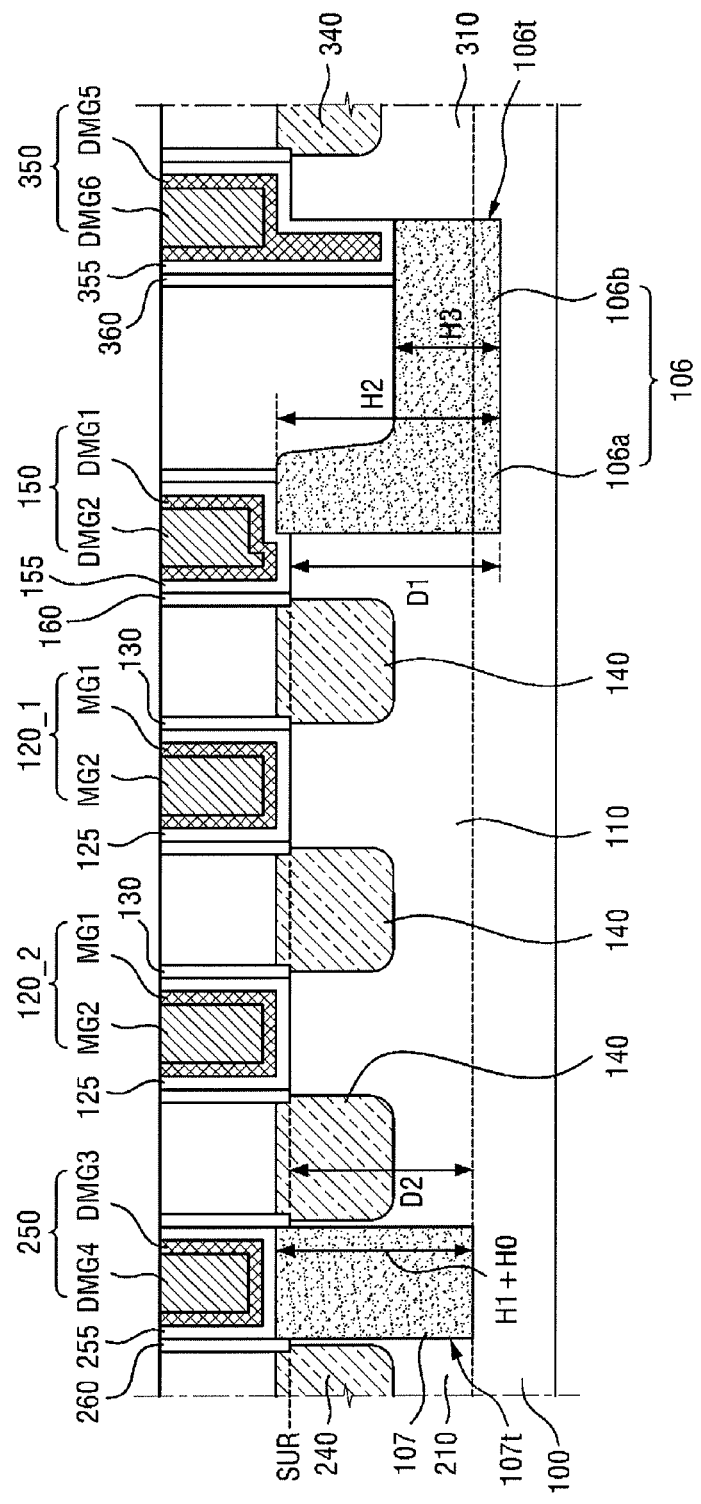
FIG. 8 illustrates a cross sectional view of a semiconductor device according to a third exemplary embodiment.

FIG. 8 is a view provided to explain a semiconductor device according to a third exemplary embodiment. For convenience of explanation, differences that are not explained above with reference to FIGS. 1 to 5 will be mainly explained below.

Referring to FIG. 8, in a semiconductor device 3 according to the third exemplary embodiment, the upper surface of the first portion 106a of the second field insulating film may be higher than the upper surface SUR of the first fin-type pattern 110 and the upper surface SUR of the third fin-type pattern 310.

Further, the upper surface of the third field insulating film 107 may be higher than the upper surface SUR of the first fin-type pattern 110 and the upper surface SUR of the second fin-type pattern 210.

That is, the upper surface 106e of the first portion 106a of the second field insulating film and the upper surface of the third field insulating film 107 may protrude upward higher than the upper surface SUR of the first fin-type pattern 110.

In other words, the depth D1 of the second trench 106t may be lower than the height H2 of the first portion 106a of the second field insulating film, and the depth D2 of the third trench 107t may be lower than the height H0+H1 of the third field insulating film 107.

A portion of the first dummy gate 150 may be located on the upper surface of the first fin-type pattern 110, and the rest of the first dummy gate 150 may be located on the protruded, first portion 106a of the second field insulating film.

Figure 9:
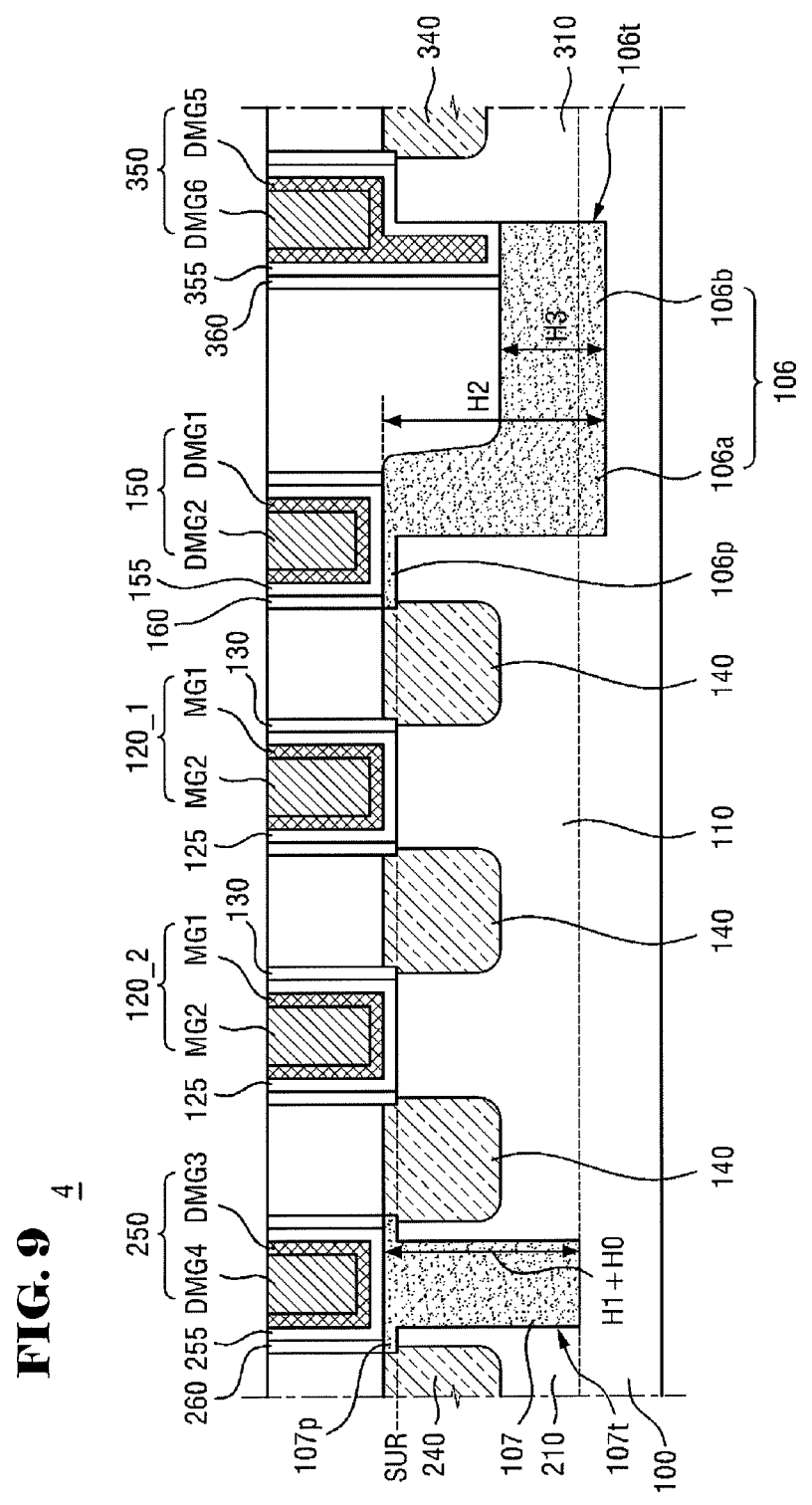

FIG. 9 is a view provided to explain a semiconductor device according to a fourth exemplary embodiment. For convenience of explanation, differences that are not explained above with reference to FIG. 8 will be mainly explained below.

Referring to FIG. 9, in the semiconductor device 6 according to the fourth exemplary embodiment, the second field insulating film 106 may further include a first protrusion 106p extending along the upper surface SUR of the first fin-type pattern 110. The first protrusion 106p of the second field insulating film 106 may protrude from the first portion 106a of the second field insulating in a direction oriented toward the first gate electrode 120_1.

In detail, at least a portion of the first dummy gate 150 may be formed on the first protrusion 106p. At least a portion of the first dummy gate 150 may be formed so as to intersect the first protrusion 106p. For example, a portion of the first dummy gate 150 may be formed on the first protrusion 106p, and the rest of the first dummy gate 150 may be formed on the first portion 106a of the second field insulating film. For example, as illustrated in FIG. 9, the first protrusion 106p may extend from the first portion 106a along an entire width of the first dummy gate 150 along the first direction X1. As such, a portion of the second field insulating film 106, i.e., portions of the first protrusion 106p and the first portion 106a, may separate between the first dummy gate 150 and the first fin-type pattern 110.

Additionally, the third field insulating film 107 may include a second protrusion 107p extending along the upper surface SUR of the first fin-type pattern 110 and the upper surface SUR of the second fin-type pattern 210. For example, the third field insulating film 107 including the second protrusion 107p may have a 'T' shape when view in a cross-section (FIG. 9).

The first dummy spacers 160 formed on both sidewalls of the first dummy gate 150 may be formed on the first portion 106a of the second field insulating film and on the first protrusion 106p. The second dummy spacers 260 formed on both sidewalls of the second dummy gate 250 may be formed on the third field insulating film 107 which includes the second protrusion 107p.

As illustrated in FIG. 9, the third field insulating film 107 may include the second protrusion 107p, although exemplary embodiments are not limited thereto. It is possible that there may be no second protrusion 107p extending from the third field insulating film 107 along the upper surfaces of the first and the second fin-type patterns 110, 210.

Figure 10A:
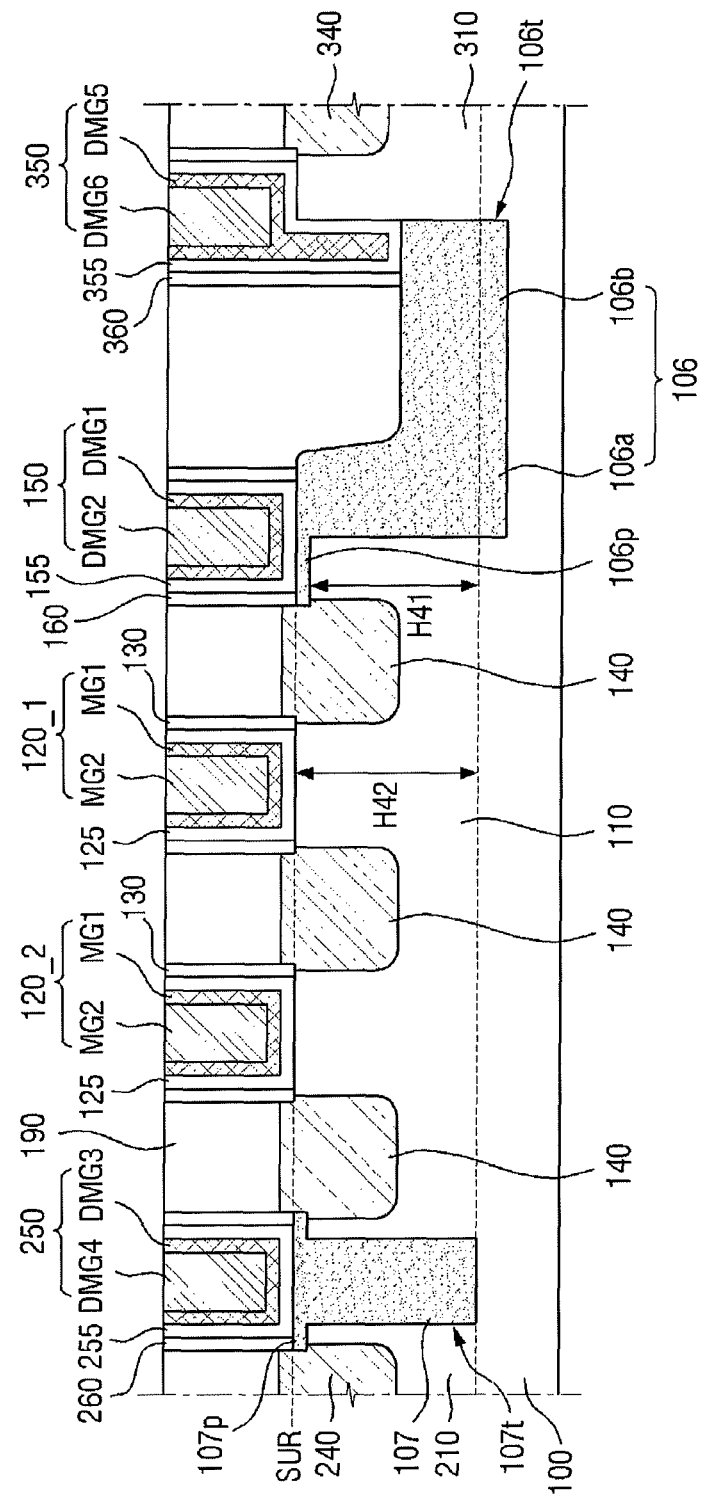
FIG. 10A illustrates a cross sectional view of a semiconductor device according to one example (5a) of a fifth exemplary embodiment.
Figure 10B:
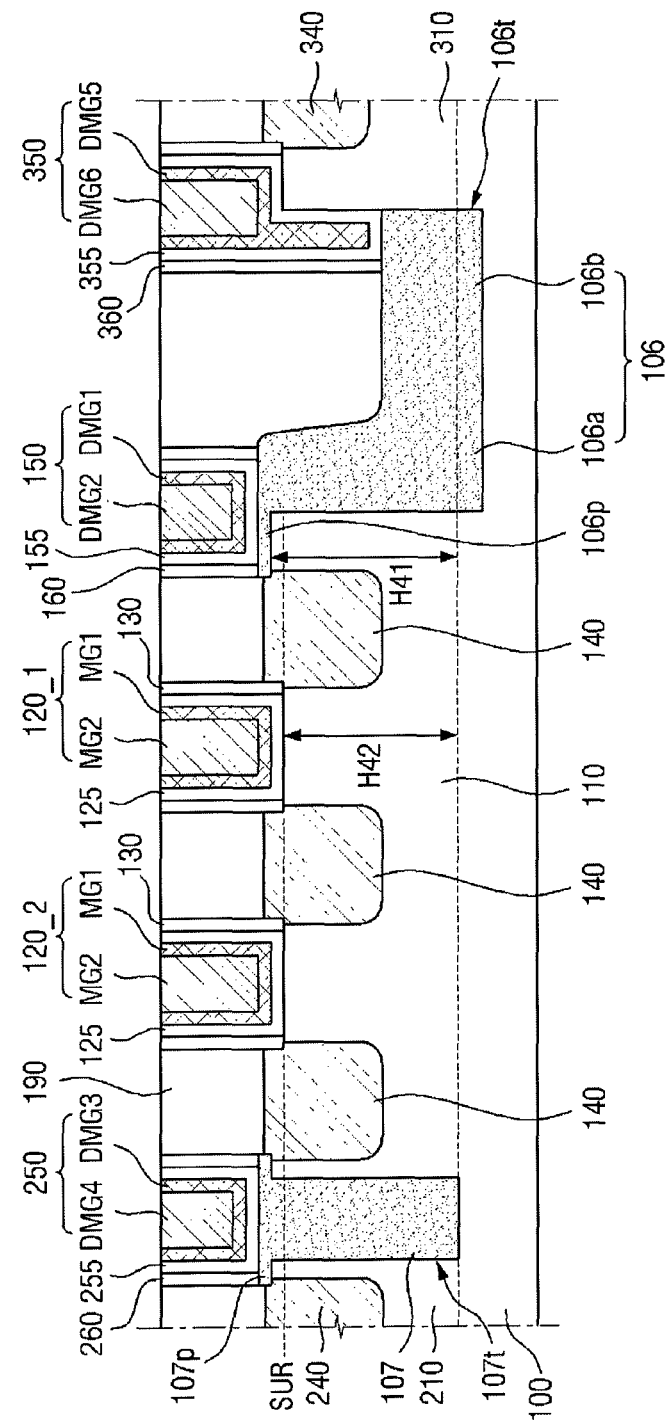
FIG. 10B illustrates a cross sectional view of a semiconductor device according to another example (5b) of the fifth exemplary embodiment.

FIG. 10A is a view provided to explain a semiconductor device according to one example (5a) of a fifth exemplary embodiment. FIG. 10B is a view provided to explain a semiconductor device according to another example (5b) of the fifth exemplary embodiment. For convenience of explanation, differences that are not explained above with reference to FIGS. 1 to 5 will be mainly explained below.

Referring to FIG. 10A, in the semiconductor device 5a according to one example (5a) of the fifth exemplary embodiment, the upper surface of the first fin-type pattern 110 at a portion overlapped with the first dummy gate 150 may be lower than the upper surface of the first fin-type pattern 110 at portions overlapped with the first gates 120_1, 120_2.

More specifically, the height H41 of the first fin-type pattern 110 at a portion overlapped with the first dummy gate 150 may be lower than the height H42 of the first fin-type pattern 110 at portions overlapped with the first gates 120_1, 120_2. In other words, at a portion overlapped with the first dummy gate 150, the upper surface of the first fin-type pattern 110 may be recessed to be lower than the other upper surface of the first fin-type pattern 110.

The second field insulating film 106 may include the first protrusion 106p protruding from the first portion 106a of the second field insulating film, between the first dummy gate 150 and the first fin-type pattern 110.

As described, the upper surface of the first fin-type pattern 110 may be recessed at a portion overlapped with the first dummy gate 150, in which case the first source/drain 140 formed between the first dummy gate 150 and the first gate 120_1 may have an asymmetrical shape.

Additionally, the third field insulating film 107 may include the second protrusion 107p protruding on the upper surfaces of the first and the second fin-type patterns 110, 210 between the second dummy gate 250 and the first fin-type pattern 110.

The height of the first fin-type pattern 110 at a portion overlapped with the second protrusion 107p of the third field insulating film 107 may be lower than the height of the first fin-type pattern 110 at portions overlapped with the first gates 120_1, 120_2.

As illustrated in FIG. 10A, the upper surface 106e of the first portion 106a of the second field insulating film and the upper surface of the third field insulating film 107 may be in the same plane as the upper surfaces SUR of the first to the third fin-type patterns 110, 210, 310, but this is only provided as an example for the purpose of explanation and exemplary embodiments are not limited thereto.

As illustrated in FIG. 10A, the third field insulating film 107 may include the second protrusion 107p interposed between the second dummy gate 250 and the first and the second fin-type patterns 110, 210, but exemplary embodiments are not limited thereto.

It is noted that the second protrusion 107p extending from the third field insulating film 107 along the upper surfaces of the first and the second fin-type patterns 110, 210 may be omitted. The upper surfaces of the first and the second fin-type patterns 110, 210 at portions contacting the third field insulating film 107 may not be recessed to be lower than the upper surface of the first fin-type pattern 110 at portions overlapped with the first gates 120_1, 120_2.

Referring to FIG. 10B, in the semiconductor device 5b according to another example (5b) of the fifth exemplary embodiment, the upper surface of the first fin-type pattern 110 at a portion overlapped with the first dummy gate 150 may be higher than the upper surface of the first fin-type pattern 110 at portions overlapped with the first gates 120_1, 120_2.

More specifically, the height H41 of the first fin-type pattern 110 at a portion overlapped with the first dummy gate 150 may be higher than the height H42 of the first fin-type pattern 110 at portions overlapped with the first gates 120_1, 120_2.

In other words, at a portion overlapped with the first dummy gate 150, the upper surface of the first fin-type pattern 110 may protrude to be higher than the other upper surface of the first fin-type pattern 110.

The second field insulating film 106 may include the first protrusion 106p protruding from the first portion 106a of the second field insulating film, between the first dummy gate 150 and the first fin-type pattern 110.

As described, the upper surface of the first fin-type pattern 110 may protrude at a portion overlapped with the first dummy gate 150, in which case the first source/drain 140 formed between the first dummy gate 150 and the first gate 120_1 may have an asymmetrical shape.

Additionally, the third field insulating film 107 may include the second protrusion 107p protruding on the upper surfaces of the first and the second fin-type patterns 110, 210 between the second dummy gate 250 and the first fin-type pattern 110.

The height of the first fin-type pattern 110 at a portion overlapped with the second protrusion 107p of the third field insulating film 107 may be higher than the height of the first fin-type pattern 110 at portions overlapped with the first gates 120_1, 120_2.

As illustrated in FIG. 10B, the upper surface 106e of the first portion 106a of the second field insulating film and the upper surface of the third field insulating film 107 may be in the same plane as the upper surfaces SUR of the first to the third fin-type patterns 110, 210, 310, but this is provided only as an example for the purpose of explanation, and exemplary embodiments are not limited thereto.

As illustrated in FIG. 10B, the third field insulating film 107 may include the second protrusion 107p interposed between the second dummy gate 250 and the first and the second fin-type patterns 110, 210, but exemplary embodiments are not limited thereto.

It is possible that there may be no second protrusion 107p extending from the third field insulating film 107 along the upper surfaces of the first and the second fin-type patterns 110, 210. That is, the upper surfaces of the first and the second fin-type patterns 110, 210 at portions contacting the third field insulating film 107 may not protrude to be higher than the upper surface of the first fin-type pattern 110 at portions overlapped with the first gates 120_1, 120_2.

Figure 11:
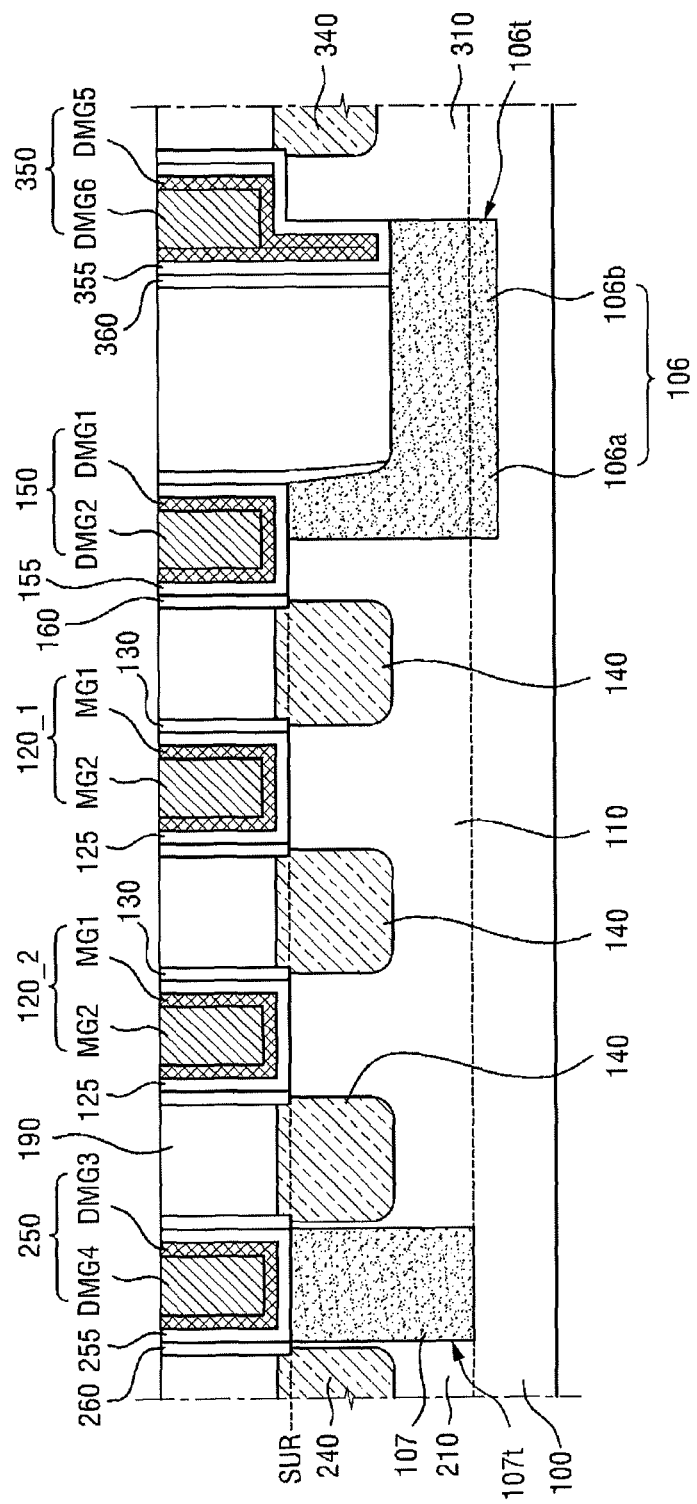
FIG. 11 illustrates a cross sectional view of a semiconductor device according to a sixth exemplary embodiment.

FIG. 11 is a view provided to explain a semiconductor device according to a sixth exemplary embodiment. For convenience of explanation, differences that are not explained above with reference to FIGS. 1 to 5 will be mainly explained below.

Referring to FIG. 11, in the semiconductor device 6 according to the sixth exemplary embodiment, one of the first dummy spacers 160 formed on both sidewalls of the first dummy gate 150 may not be formed on the upper surface of the first portion 106a of the second field insulating film.

That is, only one of the first dummy spacers 160 formed on both sidewalls of the first dummy gate 150 may be formed on the upper surface 106e of the first portion 106a of the second field insulating film, while the other may not be formed on the upper surface of the first portion 106a of the second field insulating film.

Among the first dummy spacers 160 formed on both sidewalls of the first dummy gate 150, the first dummy spacer 160 adjacent to the first fin-type pattern 110 may have a smaller height than the height of the first dummy spacer 160 which is not adjacent to the first fin-type pattern 110.

Among the first dummy spacers 160, the dummy spacer that is not formed on the upper surface 106e of the first portion 106a of the second field insulating film may be formed either on the upper surface 106d of the second portion 106b of the second field insulating film, or on a portion connecting the first portion 106a of the second field insulating film with the second portion 106b of the second field insulating film.

Overall, as illustrated in FIG. 11, the first dummy gate 150 may be formed on the upper surface 106e of the first portion 106a of the second field insulating film, but exemplary embodiments are not limited thereto. That is, at least a portion of the first dummy gate 150 may be formed on the first portion 106a of the second field insulating film.

Figure 12:
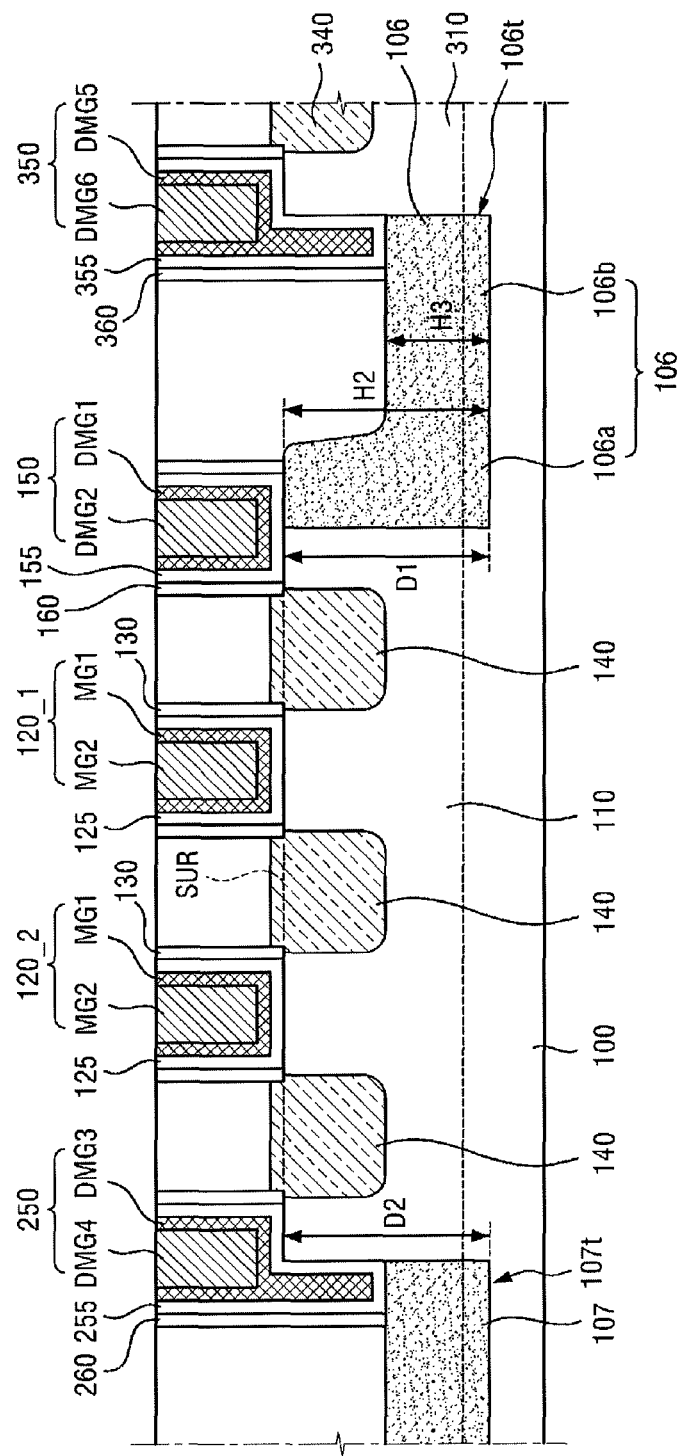
FIG. 12 illustrates a cross sectional view of a semiconductor device according to a seventh exemplary embodiment.

FIG. 12 is a view provided to explain a semiconductor device according to a seventh exemplary embodiment. For convenience of explanation, differences that are not explained above with reference to FIGS. 1 to 5 will be mainly explained below.

Referring to FIG. 12, in a semiconductor device 7 according to the seventh exemplary embodiment, the upper surface of the third field insulating film 107 may be lower than the upper surface SUR of the first fin-type pattern 110. The third field insulating film 107 may be formed in only a portion of the third trench 107t.

Further, while the first trench 105t may be a shallow trench, the second trench 106t and the third trench 107t may be deep trenches, respectively. The depth D1 of the second trench 106t may be same as the depth D2 of the third trench 107t, although exemplary embodiments are not limited thereto.

This is because the second trench 106t and the third trench 107t may be formed simultaneously. It should be noted, however, that when the second trench 106t and the third trench 107t are formed separately, the depth D1 of the second trench 106t and the depth D2 of the third trench 107t may be different from each other.

Moreover, the width of the second trench 106t in the first direction X1 may be, or may not be same as the width of the third trench 107t in the first direction X1.

The second dummy gate 250 may be formed on the first fin-type pattern 110 and the third field insulating film 107. A portion of the second dummy gate 250 may be formed on the upper surface of the third field insulating film 107 which is lower than the upper surface SUR of the first fin-type pattern 110, and the rest of the second dummy gate 250 may be formed on the first fin-type pattern 110.

As such, the second dummy gate 250 may surround the end of the first fin-type pattern 110 which protrudes higher than the upper surface of the third field insulating film 107.

The upper surface 106e of the first portion 106a of the second field insulating film is higher than the upper surface of the third field insulating film 107. As such, the bottom surface of the first dummy gate 150 may be higher than the bottom surface of the second dummy gate 250.

Further, a portion of the second dummy gate 250 may be formed on the upper surface of the third field insulating film 107, in which case the height of the second dummy gate 250 may be larger than the height of the first dummy gate 150.

The first dummy gate 150 and the second dummy gate 250 may be formed on the ends of the first fin-type pattern 110, respectively, but the first dummy gate 150 may have a different shape from the second dummy gate 250.

This is because the first dummy gate 150 is formed on the first portion 106a of the second field insulating film which is in the same plane, but the second dummy gate 250 is formed on the upper surface of the first fin-type pattern 110 and on the upper surface of the third field insulating film 107 which have different upper surfaces from each other.

Figure 13:
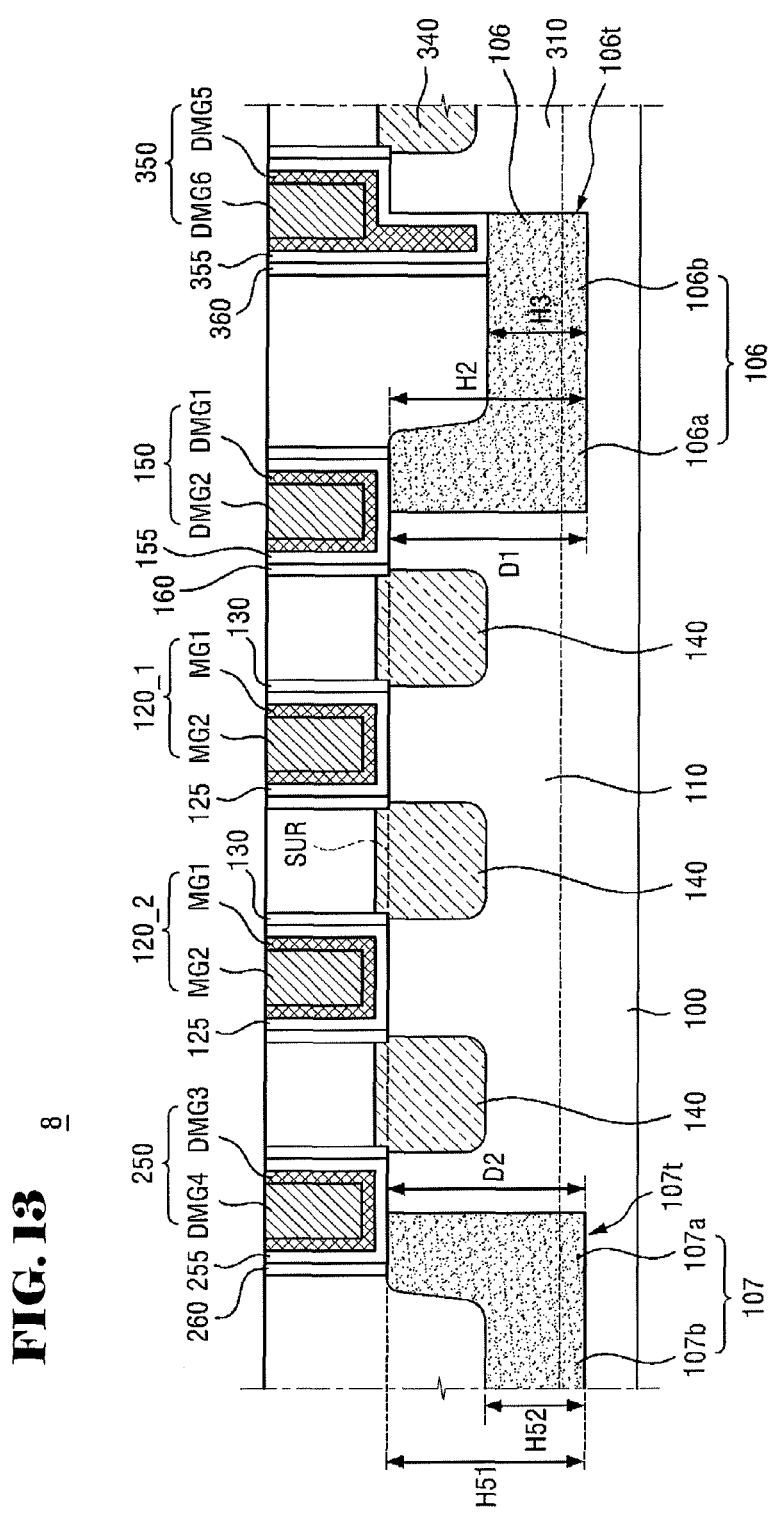

FIG. 13 is a view provided to explain a semiconductor device according to an eighth exemplary embodiment. For convenience of explanation, differences that are not explained above with reference to FIG. 12 will be mainly explained below.

Referring to FIG. 13, in a semiconductor device 8 according to the eighth exemplary embodiment, the third field insulating film 107 filling the third trench 107t may include a first portion 107a and a second portion 107b.

The height H51 of the first portion 107a of the third field insulating film and the height H52 of the second portion 107b of the third field insulating film may be different from each other. More specifically, the height H51 of the first portion 107a of the third field insulating film may be larger than the height H52 of the second portion 107b of the third field insulating film.

The first portion 107a of the third field insulating film and the second portion 107b of the third field insulating film may be located in a sequential order in the first direction X1 from the second short side 110b of the first fin-type pattern 110. That is, the first portion 107a of the third field insulating film may directly contact the short side of the first fin-type pattern 110. The first portion 107a of the third field insulating film may contact an end of the first fin-type pattern 110 which includes the second short side 110b. The first portion 107a of the third field insulating film may be located between the first fin-type pattern 110 and the second portion 107b of the third field insulating film.

As illustrated in FIG. 13, the upper surface of the first portion 107a of the third field insulating film, the upper surface 106e of the first portion 106a of the second field insulating film, and the upper surface of the first fin-type pattern 110 may be coplanar. That is, the upper surface of the first portion 107a of the third field insulating film, the upper surface 106e of the first portion 106a of the second field insulating film, and the upper surface of the first fin-type pattern 110 may be in the same plane.

Meanwhile, the upper surface of the second portion 107b of the third field insulating film may be lower than the upper surface of the first fin-type pattern 110.

The second dummy gate 250 may be disposed on the first portion 107a of the corresponding third field insulating film. There may be one second dummy gate 250 formed on the first portion 107a of the corresponding third field insulating film. The second dummy gate 250 may be formed on the first portion 107a of the third field insulating film and on the first fin-type pattern 110. At least a portion of the second dummy gate 250 may be formed so as to intersect the first fin-type pattern 110.

The bottom surface of the first dummy gate 150 and the bottom surface of the second dummy gate 250 may be higher than the upper surface of the first fin-type pattern 110. For example, the first dummy gate 150 and the second dummy gate 250 may be formed by the replacement process, in which case the upper surface of the first dummy gate 150 and the upper surface of the second dummy gate 250 may be in the same plane.

The upper surface 106e of the first portion 106a of the second field insulating film and the upper surface of the first portion 107a of the third field insulating film may be in the same plane, in which case the height of the first dummy gate 150 may be substantially the same as the height of the second dummy gate 250.

Figure 14:
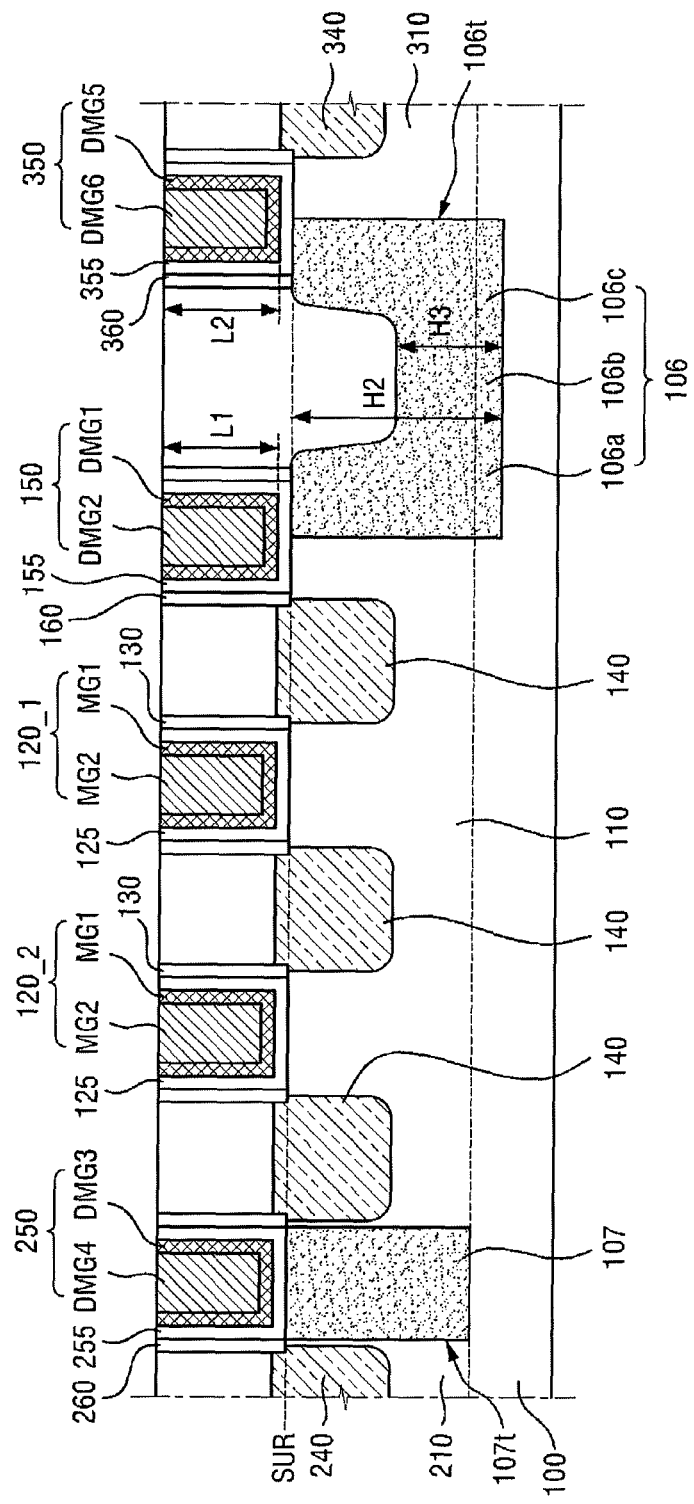
FIG. 14 illustrates a cross sectional view of a semiconductor device according to a ninth exemplary embodiment.

FIG. 14 is a view provided to explain a semiconductor device according to a ninth exemplary embodiment. For convenience of explanation, differences that are not explained above with reference to FIGS. 1 to 5 will be mainly explained below.

Referring to FIG. 14, in a semiconductor device 9 according to the ninth exemplary embodiment, the second field insulating film 106 may include a third portion 106c between the second portion 106b of the second field insulating film and the third fin-type pattern 310. The third portion 106c of the second field insulating film may be higher than the upper surface 106d of the second portion 106b of the second field insulating film.

The first to the third portions 106a, 106b, 106c of the second field insulating film may be located in a sequential order in the first direction X1 from the first short side 110a of the first fin-type pattern 110. The third portion 106c of the second field insulating film may directly contact the short side of the third fin-type pattern 310. That is, the third portion 106c of the second field insulating film may contact the end of the third fin-type pattern 310 which includes the short side.

The height of the first portion 106a of the second field insulating film may be same as the height of the third portion 106c of the second field insulating film. The height from the bottom of the second trench 106t to the upper surface of the first portion 106a of the second field insulating film may be same as the height from the bottom of the second trench 106t to the upper surface of the third portion 106c of the second field insulating film. In other words, the upper surface of the first portion 106a of the second field insulating film may be in the same plane as the upper surface of the third portion 106c of the second field insulating film.

The third dummy gate 350 may be disposed on the third portion 106c of the second field insulating film. The third dummy gate 350 may not be formed on the upper surface 106d of the second portion 106b of the second field insulating film.

The third dummy gate 350 may be formed on the third portion 106c of the second field insulating film and on the third fin-type pattern 310. At least a portion of the third dummy gate 350 may be formed so as to intersect the third fin-type pattern 310.

The bottom surface of the first dummy gate 150 and the bottom surface of the third dummy gate 350 may be higher than the upper surface of the first fin-type pattern 110. For example, the first dummy gate 150 and the third dummy gate 350 may be formed by the replacement process, in which case the upper surface of the first dummy gate 150 and the upper surface of the third dummy gate 350 may be in the same plane.

The upper surface of the first portion 106a of the second field insulating film and the upper surface of the third portion 106c of the second field insulating film may be in the same plane, in which case the height L1 of the first dummy gate 150 may be substantially the same as the height L2 of the third dummy gate 350.

Figure 15:
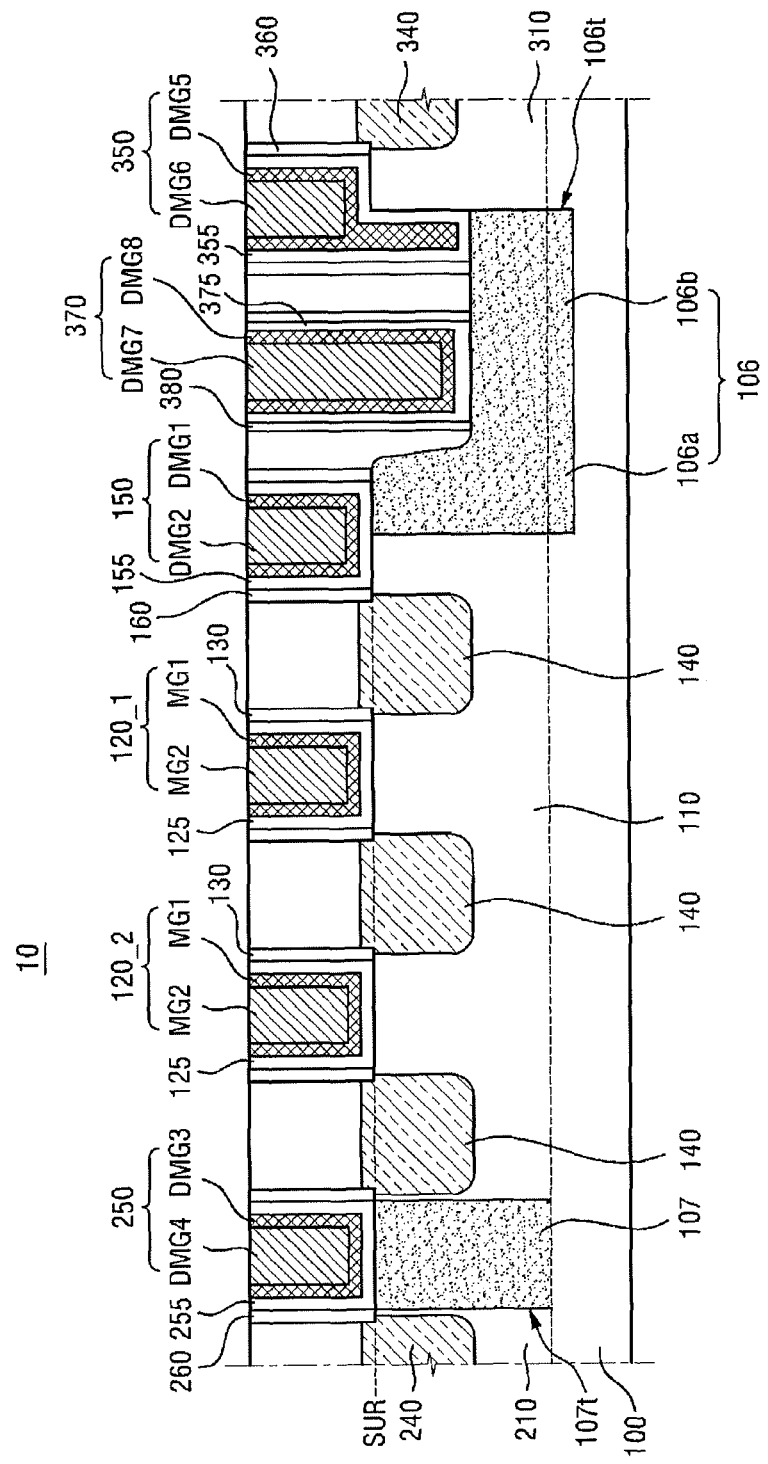
FIG. 15 illustrates a cross sectional view of a semiconductor device according to a tenth exemplary embodiment.

FIG. 15 is a view provided to explain a semiconductor device according to a tenth exemplary embodiment. For convenience of explanation, differences that are not explained above with reference to FIGS. 1 to 5 will be mainly explained below.

Referring to FIG. 15, the semiconductor device 10 according to the tenth exemplary embodiment may additionally include a fourth dummy gate 370 formed between the first dummy gate 150 and the third dummy gate 350.

The fourth dummy gate 370 may be formed on the second portion 106b of the second field insulating film. The fourth dummy gate 370 may have a stack of two or more metal layers DGM7, DGM8. The fourth dummy gate 370 may include a material substantially the same as the first dummy gate 150.

The upper surface 106e of the first portion 106a of the second field insulating film may be higher than the upper surface 106d of the second portion 106b of the second field insulating film. As such, the bottom surface of the first dummy gate 150 may be higher than the bottom surface of the fourth dummy gate 370 formed on the second portion 106b of the second field insulating film.

Further, the upper surface of the first dummy gate 150 and the upper surface of the fourth dummy gate 370 may be in the same plane, in which case the height of the fourth dummy gate 370 may be higher than the height of the first dummy gate 150.

Additionally, a portion of the third dummy gate 350 may be formed on the upper surface of the second portion 106b of the second field insulating film. Accordingly, the height of the third dummy gate 350 may be substantially the same as the height of the fourth dummy gate.

However, as a portion of the third dummy gate 350 spans over the third fin-type pattern 310, the shape of the third dummy gate 350 may be different from the shape of the fourth dummy gate 370.

Figure 16:
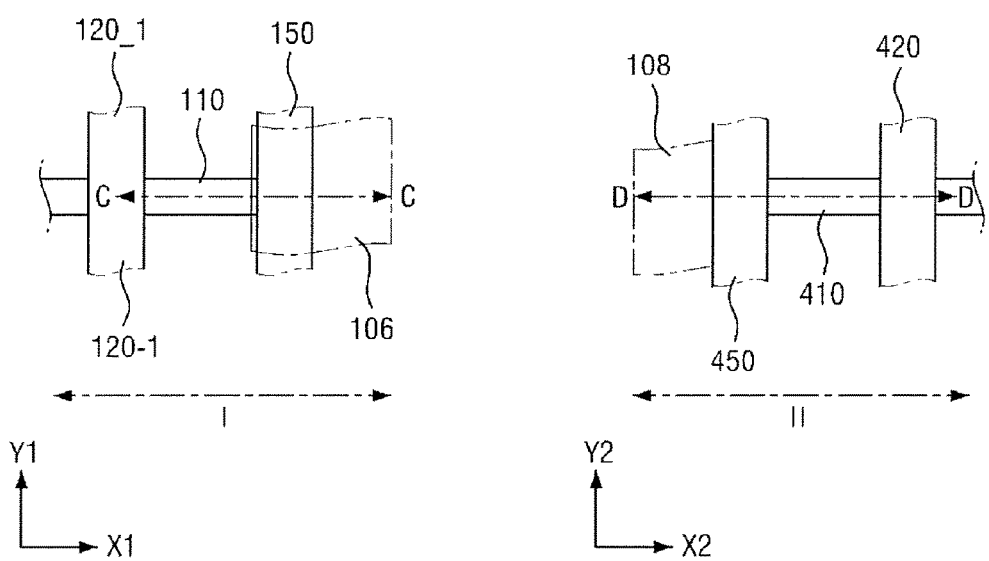
FIG. 16 illustrates a top view of a semiconductor device according to an eleventh exemplary embodiment.
Figure 17:
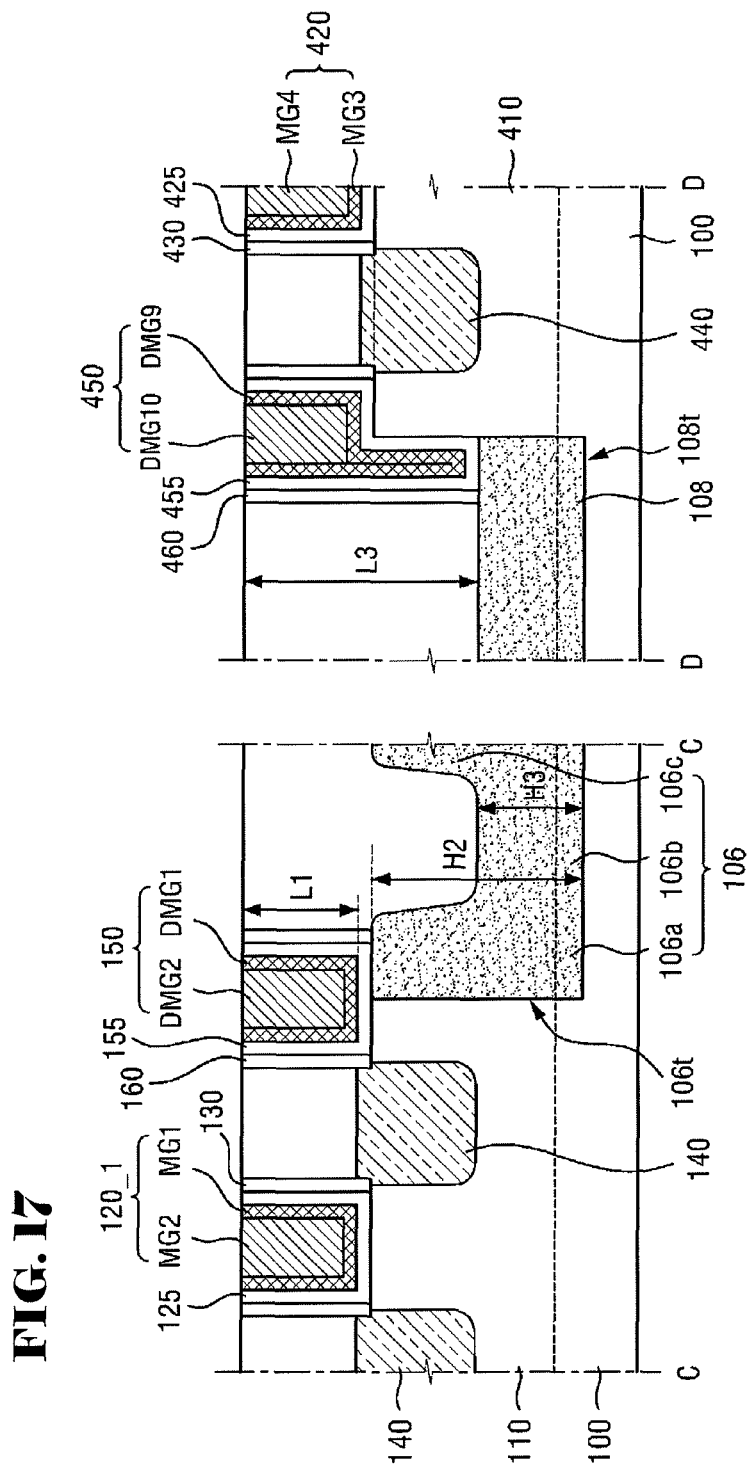
FIG. 17 illustrates a cross sectional view taken along lines C-C and D-D of FIG. 16.

FIG. 16 is a top view provided to explain a semiconductor device according to an eleventh exemplary embodiment. FIG. 17 is a cross sectional view taken along lines C-C and D-D of FIG. 16.

Referring to FIGS. 16 and 17, the semiconductor device 11 according to the eleventh exemplary embodiment may include field insulating films 106, 108, a first fin-type pattern 110, a first gate 120_1, a first dummy gate 150 and a fifth dummy gate 450.

The substrate 100 may include a first region I and a second region II. The first region I and the second region II may be spaced from each other, or connected with each other.

The first fin-type pattern 110, the first gate 120_1, the first dummy gate 150 and the second field insulating film 106 may be formed in the first region I of the substrate 100.

A second field insulating film 106 formed in a second trench 106t in contact with a short side of the first fin-type pattern 110 may include a first portion 106a, a second portion 106b and a third portion 106c.

These will not be additionally described below, but referred to the description provided above with reference to FIGS. 1 to 5 and 14.

In a semiconductor device according to the eleventh exemplary embodiment, the semiconductor device formed in the first region I of the substrate 100 is illustrated partially in a similar manner as the semiconductor device 9 according to the ninth exemplary embodiment. However, this is provided only for the sake of convenience in explanation, and exemplary embodiments are not limited thereto.

Also for convenience of explanation, in the semiconductor device according to the eleventh exemplary embodiment, the semiconductor device formed in the first region I of the substrate 100 is partially illustrated, so that only the portion including the first fin-type pattern 110 and the first dummy gate 150 is illustrated.

The fourth fin-type pattern 410, the third gate 420, the fifth dummy gate 450, and the fourth field insulating film 108 may be formed in the second region II of the substrate 100.

The fourth fin-type pattern 410 may protrude from the substrate 100. The fourth fin-type pattern 410 may be elongated in a third direction X2.

The fourth trench 108t may be formed in contact with the short side of the fourth fin-type pattern 410. The fourth field insulating film 108 formed on the substrate 100 may be formed in the fourth trench 108t. The fourth field insulating film 108 may be formed in only a portion of the fourth trench 108t.

The upper surface of the fourth field insulating film 108, which is formed in contact with the short side of the fourth fin-type pattern 410, may be lower than the upper surface of the fourth fin-type pattern 410.

Based on the assumption that the upper surface of the first fin-type pattern 110 and the upper surface of the fourth fin-type pattern 410 are in the same plane, the upper surface of the fourth field insulating film 108 may be lower than the upper surface of the first portion 106a of the second field insulating film.

The third gate 420 may be formed on the fourth fin-type pattern 410 so as to intersect the fourth fin-type pattern 410. The third gate 420 may extend in a fourth direction Y2. The third gate 420 may include a stack of two or more metal layers MG3, MG4.

The fifth dummy gate 450 extending in the fourth direction Y2 may be formed on the fourth fin-type pattern 410 and the fourth field insulating film 108. The fifth dummy gate 450 may have a stack of two or more metal layers DGM9, DGM10.

A portion of the fifth dummy gate 450 may be formed on the fourth field insulating film 108 which is lower than the upper surface of the fourth fin-type pattern 410. As such, the fifth dummy gate 450 may surround the end of the fourth fin-type pattern 410 which protrudes higher than the upper surface of the fourth field insulating film 108.

The upper surface of the first portion 106a of the second field insulating film is higher than the upper surface of the fourth field insulating film 108. As such, the bottom surface of the first dummy gate 150 may be higher than the bottom surface of the fifth dummy gate 450.

A portion of the fifth dummy gate 450 may be formed on the upper surface of the fourth field insulating film 108 which is lower than the upper surface of the fourth fin-type pattern 410. Accordingly, the height L3 of the fifth dummy gate 450 may be different from the height L1 of the first dummy gate 150.

Specifically, a portion of the fifth dummy gate 450 may be formed on the upper surface of the fourth field insulating film 108 which is lower than the upper surface of the first portion 106a of the second field insulating film, in which case the height of the fifth dummy gate 450 may be higher than the height of the first dummy gate 150.

Figure 18:
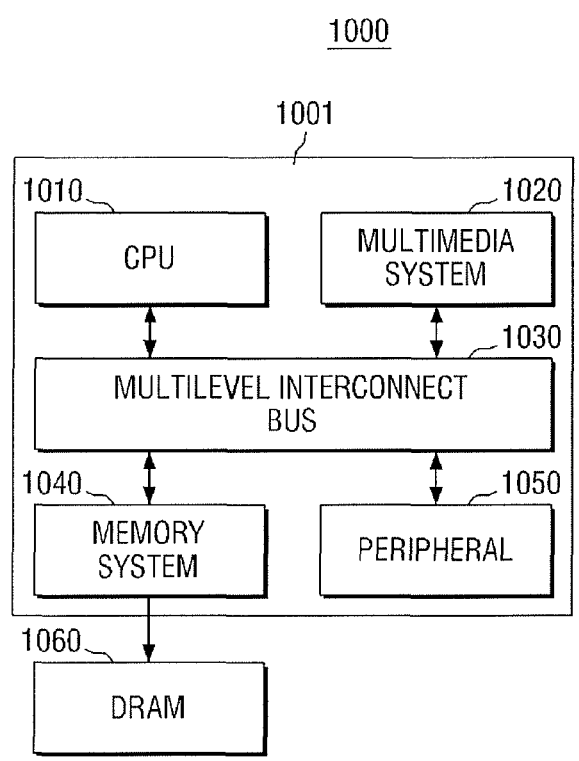
FIG. 18 illustrates a block diagram of a system-on-chip (SOC) including a semiconductor device according to exemplary embodiments.

FIG. 18 is a block diagram of a SoC system including a semiconductor device according to exemplary embodiments.

Referring to FIG. 18, a SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some exemplary embodiments, the CPU 1010 may be configured on a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), although exemplary embodiments are not limited herein.

The memory system 1040 may provide environments necessary for the application processor 1001 to connect to an external memory (e.g., DRAM 1060) and perform high-speed operation. In some exemplary embodiments, the memory system 1040 may include a separate controller (e.g., DRAM controller) to control an external memory (e.g., DRAM 1060).

The peripheral circuit 1050 may provide environments necessary for the SoC system 1000 to have a smooth connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the exemplary embodiments explained above.

Figure 19:
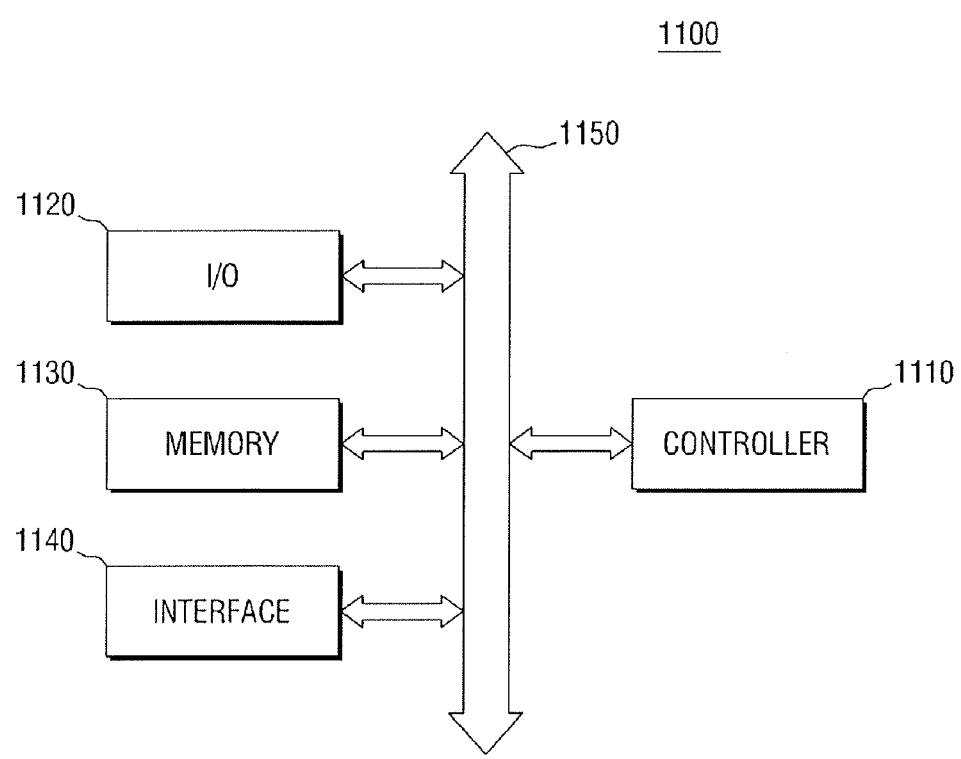
FIG. 19 illustrates a block diagram of an electronic system including a semiconductor device according to exemplary embodiments.

FIG. 19 is a block diagram of an electronic system including a semiconductor device according to exemplary embodiments.

Referring to FIG. 19, the electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro controller and logic devices capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

According to the exemplary embodiments described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 20:
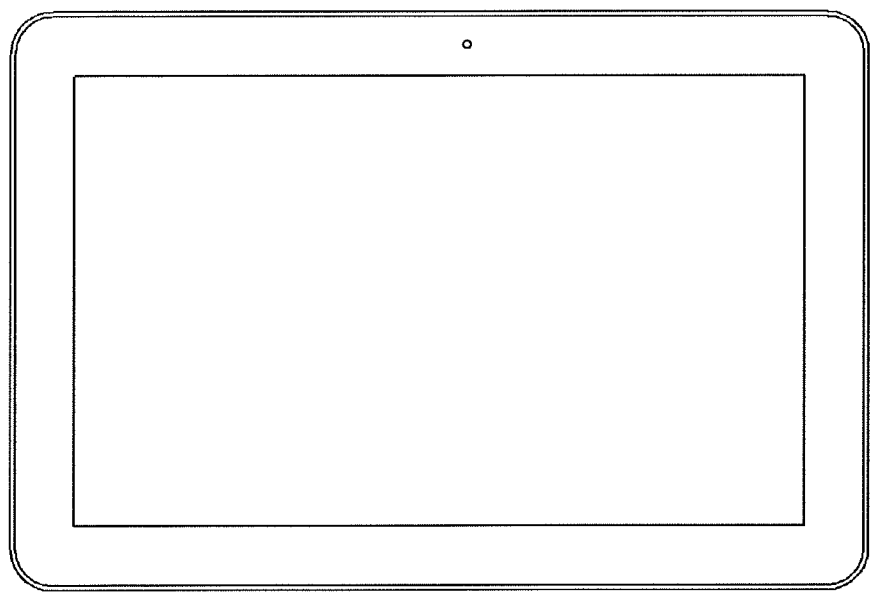
FIGS. 20 to 22 illustrate exemplary semiconductor systems including a semiconductor device according to exemplary embodiments.
Figure 21:
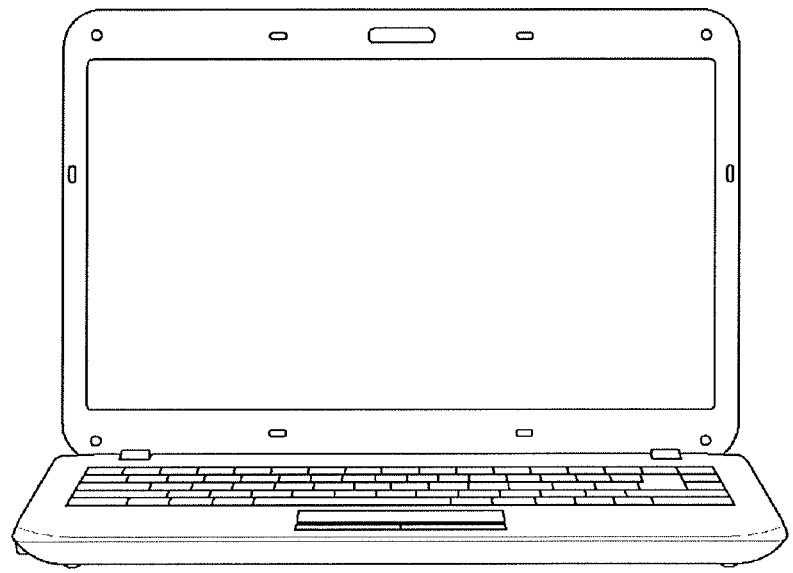
Figure 22:
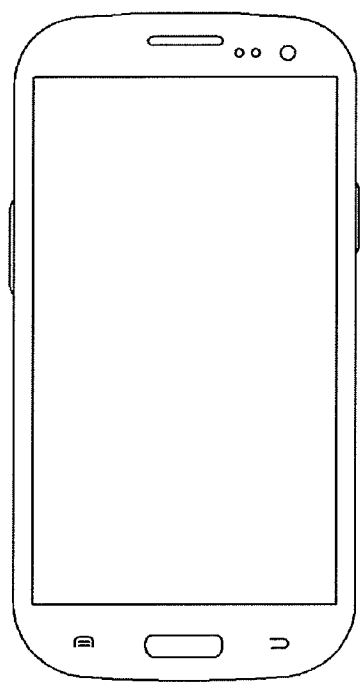

FIGS. 20 to 22 illustrate exemplary semiconductor systems which may apply therein a semiconductor device according to exemplary embodiments.

FIG. 20 illustrates a tablet PC 1200, FIG. 21 illustrates a laptop computer 1300, and FIG. 22 illustrates a smartphone 1400. According to the exemplary embodiments explained above, the semiconductor device may be used in these devices, i.e., in the tablet PC 1200, the laptop computer 1300 or the smartphone 1400.

Further, it is apparent to those skilled in the art that the semiconductor device according to exemplary embodiments is applicable to another integrated circuit device not illustrated herein.

That is, while the tablet PC 1200, the laptop computer 1300 and the smartphone 1400 are exemplified herein as a semiconductor system according to the exemplary embodiments, the exemplary embodiments of the semiconductor system are not limited to any of the examples given above.

In some exemplary embodiments, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

By way of summation and review, a semiconductor device according to embodiments includes a gate that is not wrapped around an end of a fin-type pattern, i.e., the gate overlaps only the upper surface of the fin-type pattern. As such, the semiconductor device exhibits reduced leakage current, e.g., as leakage current is minimized between the gate and fin-type pattern end, and enhanced operation performance. Further, the semiconductor device may include an oxide layer between gate and end of the fin-type pattern, which raises the terminal gate's bottom above the fin-type pattern, thereby further minimizing overlap between the gate and fin-type pattern to reduce leakage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a fin-type pattern including a first short side and a second short side opposed to each other;
a first trench in contact with the first short side;
a second trench in contact with the second short side;
a first field insulating film in the first trench, the first field insulating film including a first portion and a second portion arranged sequentially from the first short side, and a height of the first portion being different from a height of the second portion;
a second field insulating film in the second trench; and
a first dummy gate on the first portion of the first field insulating film, the first dummy gate overlapping the fin-type pattern and the first short side to be on the first portion of the first field insulating film,
wherein a height from a bottom of the first trench to an upper surface of the first portion of the first field insulating film is larger than a height from the bottom of the first trench to an upper surface of the second portion of the first field insulating film.

2. The semiconductor device as claimed in claim 1, wherein at least a portion of the first dummy gate intersects the fin-type pattern.

3. The semiconductor device as claimed in claim 1, wherein the first portion of the first field insulating film is in contact with an end of the fin-type pattern which includes the first short side.

4. The semiconductor device as claimed in claim 1, wherein an upper surface of the second field insulating film is in a same plane as or higher than an upper surface of the fin-type pattern.

5. The semiconductor device as claimed in claim 4, further comprising a second dummy gate on the second field insulating film.

6. A semiconductor device, comprising:
a first fin-type pattern and a second fin-type pattern in an elongated alignment in a first direction;
a trench between the first fin-type pattern and the second fin-type pattern;
a field insulating film in the trench, the field insulating film extending in a second direction intersecting the first direction, and including a first portion and a second portion arranged in the first direction in a sequential order from the first fin-type pattern, wherein a height of the first portion is larger than a height of the second portion;
a first dummy gate on the first fin-type pattern and on the first portion of the field insulating film; and
a second dummy gate on the second fin-type pattern and on the field insulating film.

7. The semiconductor device as claimed in claim 6, wherein an upper surface of the first portion of the field insulating film is in a same plane as or higher than an upper surface of the first fin-type pattern and an upper surface of the second fin-type pattern.

8. The semiconductor device as claimed in claim 6, further comprising a third dummy gate between the first dummy gate and the second dummy gate, and on the second portion of the field insulating film.

9. A semiconductor device, comprising:
a fin-type pattern having first and second short sides spaced apart from each other along a first direction;
a first trench in contact with the first short side of the fin-type pattern;
a first field insulating film in the first trench, the first field insulating film including a first portion and a second portion arranged sequentially from the first short side, and a height of the first portion being different from a height of the second portion; and
a dummy gate only on the first portion of the first field insulating film among the first and second portions of the first field insulating film, the dummy gate overlapping the fin-type pattern only along the first direction.

10. The semiconductor device as claimed in claim 9, wherein the first portion of the first field insulating film contacts the first short side of the fin-type pattern and has an upper surface that is coplanar with an upper surface of the fin-type pattern, the dummy gate contacting a single surface of each of the first portion of the first field insulating film and the fin-type pattern.

11. The semiconductor device as claimed in claim 9, wherein the dummy gate overlaps only a single surface of the fin-type pattern.

* * * * *